United States Patent
Wang et al.

(10) Patent No.: US 11,864,439 B2
(45) Date of Patent: Jan. 2, 2024

(54) DISPLAY PANEL AND DISPLAY DEVICE

(71) Applicant: BOE TECHNOLOGY GROUP CO., LTD., Beijing (CN)

(72) Inventors: Li Wang, Beijing (CN); Tian Dong, Beijing (CN); Long Han, Beijing (CN); Jie Zhang, Beijing (CN); Jingquan Wang, Beijing (CN); Bo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 17/621,770

(22) PCT Filed: Jan. 19, 2021

(86) PCT No.: PCT/CN2021/072695
§ 371 (c)(1),
(2) Date: Dec. 22, 2021

(87) PCT Pub. No.: WO2022/141680
PCT Pub. Date: Jul. 7, 2022

(65) Prior Publication Data
US 2023/0157098 A1 May 18, 2023

(30) Foreign Application Priority Data

Dec. 28, 2020 (WO) ................ PCT/CN2020/140199

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC ... G09G 3/3233; G09G 3/3258; H10K 59/131
See application file for complete search history.

(56) References Cited

U.S. PATENT DOCUMENTS 8,822,987 B2  9/2014 Fujita et al.
9,196,195 B2  11/2015 Tamura et al.
(Continued)

FOREIGN PATENT DOCUMENTS

CN  103137068 A  6/2013
CN  104064581 A  9/2014
(Continued)

OTHER PUBLICATIONS

International Search Report of PCT/CN2021/072707 in Chinese, dated Sep. 29, 2021.
(Continued)

*Primary Examiner* — Sardis F Azongha
(74) *Attorney, Agent, or Firm* — Collard & Roe, P.C.

(57) ABSTRACT

Disclosed are a display panel and a display device. The display panel includes a base substrate; a pixel unit on the base substrate and including a pixel circuit and a light-emitting element, the pixel circuit being configured to drive the light-emitting element, the pixel circuit being closer to the base substrate than the light-emitting element and including a driving transistor; a data line configured to provide data signal to the pixel circuit; a connection element through which the light-emitting element is connected with the pixel circuit, the connection element including a shielding portion; and a connection line connected with a gate electrode of the driving transistor. The data line includes two adjacent data lines with the shielding portion located therebetween, and an orthographic projection of the connection
(Continued)

line on the base substrate at least partially overlaps with an orthographic projection of the shielding portion on the base substrate.

20 Claims, 20 Drawing Sheets

(51) Int. Cl.
*G09G 3/3266* (2016.01)
*G09G 3/3275* (2016.01)
*H10K 59/121* (2023.01)
*H10K 102/00* (2023.01)

(52) U.S. Cl.
CPC ......... *G09G 3/3275* (2013.01); *H10K 59/121* (2023.02); *G09G 2300/0426* (2013.01); *G09G 2300/0819* (2013.01); *G09G 2300/0842* (2013.01); *G09G 2300/0861* (2013.01); *G09G 2320/0214* (2013.01); *G09G 2320/0247* (2013.01); *G09G 2330/02* (2013.01); *G09G 2330/021* (2013.01); *H10K 2102/302* (2023.02)

(56) References Cited

U.S. PATENT DOCUMENTS

| | | | |
|---|---|---|---|
| 9,952,478 B2 | 4/2018 | Hong et al. | |
| 10,062,743 B2 | 8/2018 | Lee et al. | |
| 10,403,704 B2 * | 9/2019 | Chae | H10K 59/126 |
| 10,431,604 B2 * | 10/2019 | Cho | H01L 27/124 |
| 10,510,822 B2 | 12/2019 | Kim et al. | |
| 10,971,073 B2 | 4/2021 | Kumura | |
| 11,062,652 B1 | 7/2021 | Zhou et al. | |
| 11,176,883 B2 | 11/2021 | Na et al. | |
| 11,195,893 B2 * | 12/2021 | Lee | H10K 59/1216 |
| 11,257,432 B2 | 2/2022 | Yuan et al. | |
| 2008/0082648 A1 | 4/2008 | Ahmed et al. | |
| 2009/0303164 A1 | 12/2009 | Kajiyama et al. | |
| 2016/0210905 A1 | 7/2016 | Lee et al. | |
| 2017/0179165 A1 | 6/2017 | Lan | |
| 2019/0088209 A1 | 3/2019 | Kang et al. | |
| 2020/0052053 A1 | 2/2020 | Song et al. | |
| 2020/0066825 A1 | 2/2020 | Yang et al. | |
| 2020/0105849 A1 | 4/2020 | Kim et al. | |
| 2020/0168147 A1 | 5/2020 | Na et al. | |
| 2022/0102459 A1 | 3/2022 | Yang et al. | |
| 2023/0157098 A1 | 5/2023 | Wang et al. | |

FOREIGN PATENT DOCUMENTS

| | | |
|---|---|---|
| CN | 105093731 A | 11/2015 |
| CN | 106449651 A | 2/2017 |
| CN | 106952940 A | 7/2017 |
| CN | 107369690 A | 11/2017 |
| CN | 108565269 U | 9/2018 |
| CN | 108878476 A | 11/2018 |
| CN | 109698225 A | 4/2019 |
| CN | 110335564 A | 10/2019 |
| CN | 110970469 A | 4/2020 |
| CN | 110992880 A | 4/2020 |
| CN | 111048041 A | 4/2020 |
| CN | 111095387 A | 5/2020 |
| CN | 111243510 A | 6/2020 |
| CN | 210667751 U | 6/2020 |
| CN | 111508977 A | 8/2020 |
| CN | 111681549 A | 9/2020 |
| CN | 111951729 A | 11/2020 |
| CN | 112017593 A | 12/2020 |
| CN | 112071268 A | 12/2020 |
| CN | 111681549 B | 3/2022 |
| KR | 10-2015-0062692 A | 6/2015 |

OTHER PUBLICATIONS

Written Opinion of the International Searching Authority of PCT/CN2021/072707 in Chinese, dated Sep. 29, 2021.
International Search Report of PCT/CN2020/140199 in Chinese, dated Sep. 28, 2021.
Written Opinion of the International Searching Authority of PCT/CN2020/140199 in Chinese, dated Sep. 28, 2021.
International Search Report of PCT/CN2021/072695 in Chinese, dated Sep. 28, 2021.
Written Opinion of the International Searching Authority of PCT/CN2021/072695 in Chinese, dated Sep. 28, 2021.
U.S. Office Action in U.S. Appl. No. 17/621,861 dated May 31, 2023.
U.S. Office Action in U.S. Appl. No. 17/615,950 dated Jul. 18, 2023.

* cited by examiner

DISPLAY PANEL AND DISPLAY DEVICE

CROSS REFERENCE TO RELATED APPLICATIONS

This application is a U.S. National Phase Entry of International Application No. PCT/CN2021/072695 filed on Jan. 19, 2021, designating the United States of America and claiming priority to International Application No. PCT/CN2020/140199, filed on Dec. 28, 2020. The present application claims priority to and the benefit of the above-identified applications and the above-identified applications are incorporated by reference herein in their entirety.

TECHNICAL FIELD

Embodiments of the present disclosure relate to a display panel and a display device.

BACKGROUND

With the continuous development of display technology, active-matrix organic light-emitting diode (AMOLED) display technology has been more and more used in mobile phones, tablet computers, digital cameras and other display devices because of its advantages of self-illumination, wide viewing angle, high contrast, low power consumption and high response speed.

SUMMARY

At least one embodiment of the disclosure provides a display panel and a display device.

In one aspect, at least one embodiment of the disclosure provides a display panel, comprising: a base substrate; a pixel unit, located on the base substrate and comprising a pixel circuit and a light-emitting element, the pixel circuit being configured to drive the light-emitting element, the pixel circuit comprising a driving transistor and a threshold compensation transistor, a first electrode of the threshold compensation transistor being connected with a second electrode of the driving transistor, a second electrode of the threshold compensation transistor being connected with a gate electrode of the driving transistor; a first power line, configured to supply a first power supply voltage to the pixel circuit; a blocker, electrically connected with the first power line; and a first conductive structure, connected with the gate electrode of the driving transistor, wherein the threshold compensation transistor comprises a first channel and a second channel, and the first channel and the second channel are connected by a conductive connection portion; an orthographic projection of the blocker on the base substrate at least partially overlaps with an orthographic projection of the conductive connection portion on the base substrate; an orthographic projection of the first conductive structure on the base substrate at least partially overlaps with the orthographic projection of the blocker on the base substrate; an area of an orthographic projection of a portion of the blocker overlapping with the first conductive structure on the base substrate is larger than an area of an orthographic projection of a portion of the blocker overlapping with the conductive connection portion on the base substrate.

For example, in some embodiments of the disclosure, a material of the first conductive structure is the same as a material of the conductive connection portion.

For example, in some embodiments of the disclosure, a material of the first conductive structure comprises a conductive material obtained by doping a semiconductor material.

For example, in some embodiments of the disclosure, the display panel further comprises a connection line, wherein the first conductive structure is connected with the gate electrode of the driving transistor through the connection line.

For example, in some embodiments of the disclosure, a material of the first conductive structure is different from a material of the connection line.

For example, in some embodiments of the disclosure, the connection line is in contact with the gate electrode of the driving transistor and the first conductive structure, respectively.

For example, in some embodiments of the disclosure, the first conductive structure, the connection line and the gate electrode of the driving transistor constitute a gate signal portion of the driving transistor.

For example, in some embodiments of the disclosure, the pixel circuit further comprises a first reset transistor, a second electrode of the first reset transistor is connected with the gate electrode of the driving transistor, and the first conductive structure is multiplexed as the second electrode of the first reset transistor.

For example, in some embodiments of the disclosure, the display panel further comprises a first reset control signal line and a first initialization signal line, wherein a gate electrode of the first reset transistor is connected with the first reset control signal line, a first electrode of the first reset transistor is connected with the first initialization signal line, and an orthographic projection of the first electrode of the first reset transistor on the base substrate at least partially overlaps with the orthographic projection of the blocker on the base substrate.

For example, in some embodiments of the disclosure, the display panel further comprises a data line and a second conductive structure, wherein the data line is configured to provide a data signal to the pixel circuit, the data line is connected with the second conductive structure, and the orthographic projection of the blocker on the base substrate at least partially overlaps with an orthographic projection of the second conductive structure on the base substrate.

For example, in some embodiments of the disclosure, an area of an orthographic projection of a portion of the blocker overlapping with the second conductive structure on the base substrate is larger than the area of the orthographic projection of the portion of the blocker overlapping with the conductive connection portion on the base substrate.

For example, in some embodiments of the disclosure, the area of the orthographic projection of the portion of the blocker overlapping with the first conductive structure on the base substrate is larger than the area of the orthographic projection of the portion of the blocker overlapping with the second conductive structure on the base substrate.

For example, in some embodiments of the disclosure, the orthographic projection of the blocker on the base substrate at least partially overlaps with the orthographic projection of the data line on the base substrate.

For example, in some embodiments of the disclosure, the display panel further comprises a gate line, wherein a gate electrode of the threshold compensation transistor is connected with the gate line, and the pixel circuit further comprises a data writing transistor, wherein a first electrode of the data writing transistor is connected with the data line, a second electrode of the data writing transistor is connected with a first electrode of the driving transistor, and a gate electrode of the data writing transistor is connected with the gate line; the second conductive structure is multiplexed as the first electrode of the data writing transistor.

For example, in some embodiments of the disclosure, the display panel further comprises a first connection electrode, wherein the data line is connected with the second conductive structure through the first connection electrode.

For example, in some embodiments of the disclosure, the data line, the first connection electrode and the second conductive structure constitute a data signal portion.

For example, in some embodiments of the disclosure, the pixel unit comprises a first pixel unit, a second pixel unit, and a third pixel unit, the first pixel unit and the second pixel unit are adjacent in a first direction, and the first pixel unit and the third pixel unit are adjacent in a second direction, the first direction intersects with the second direction; the data line include a first data line, a second data line and a third data line, and the first data line is configured to provide a first data signal to the pixel circuit of the first pixel unit; the second data line is configured to provide a second data signal to the pixel circuit of the second pixel unit, the third data line is configured to provide a third data signal to the pixel circuit of the third pixel unit, the third data line is located between the first data line and the second data line; the orthographic projection of the blocker on the base substrate at least partially overlaps with the orthographic projection of the third data line on the base substrate.

For example, in some embodiments of the disclosure, the blocker is located between the first data line and the second data line.

For example, in some embodiments of the disclosure, the blocker is located between the second conductive structure and the third data line in a direction perpendicular to the base substrate.

For example, in some embodiments of the disclosure, the orthographic projection of the second conductive structure on the base substrate at least partially overlaps with the orthographic projection of the third data line on the base substrate.

For example, in some embodiments of the disclosure, the display panel further comprises a connection element, wherein the light-emitting element is connected with the pixel circuit through the connection element, and the connection element comprises a shielding portion, the data line comprises two adjacent data lines, and the shielding portion is positioned between the two adjacent data lines, and the orthographic projection of the connection line on the base substrate at least partially overlaps with the orthographic projection of the shielding portion on the base substrate.

For example, in some embodiments of the disclosure, the connection element further comprises a second connection electrode, and the pixel circuit is connected with the second connection electrode, and the second connection electrode is connected with the shielding portion, and the shielding portion is connected with the light-emitting element.

For example, in some embodiments of the disclosure, the pixel unit further comprises a fourth pixel unit adjacent to the second pixel unit in the second direction and adjacent to the third pixel unit in the first direction, the data line further includes a fourth data line configured to provide a fourth data signal to the pixel circuit of the fourth pixel unit, the orthographic projection of the blocker on the base substrate at least partially overlaps with the orthographic projection of the fourth data line on the base substrate.

For example, in some embodiments of the disclosure, the blocker has a first edge overlapping with the fourth data line, and an included angle between the first edge and the fourth data line is greater than zero and less than 90°.

For example, in some embodiments of the disclosure, the blocker has a second edge overlapping with the third data line, and an included angle between the second edge and the third data line is greater than zero and less than 90°.

For example, in some embodiments of the disclosure, the fourth data line is located between the third data line and the second data line.

For example, in some embodiments of the disclosure, the first pixel unit, the second pixel unit, the third pixel unit and the fourth pixel unit constitute a repeating unit.

For example, in some embodiments of the disclosure, the blocker comprises a first portion, a second portion, and a third portion, the first portion extends along a first direction, the second portion extends along a second direction, and the third portion extends along the first direction, and the first portion and the third portion are connected through the second portion, and the first portion and the second portion form an inverted T-shape.

For example, in some embodiments of the disclosure, the first portion, the second portion and the third portion are located on the same layer and have an integrated structure.

For example, in some embodiments of the disclosure, the pixel circuit further comprises a storage capacitor, a first electrode of the storage capacitor is connected with the gate electrode of the driving transistor, and a second electrode of the storage capacitor is connected with the first power line.

For example, in some embodiments of the disclosure, the display panel further comprises a second reset control signal line and a second initialization signal line, wherein the pixel circuit further comprises a second reset transistor, a gate electrode of the second reset transistor is connected with the second reset control signal line, a first electrode of the second reset transistor is connected with the second initialization signal line, and a second electrode of the second reset transistor is connected with a first electrode of the light-emitting element.

For example, in some embodiments of the disclosure, the display panel further comprises a light-emitting control signal line, wherein the pixel circuit further comprises a first light-emitting control transistor and a second light-emitting control transistor, a gate electrode of the first light-emitting control transistor is connected with the light-emitting control signal line, a first electrode of the first light-emitting control transistor is connected with a first power supply terminal, and a second electrode of the first light-emitting control transistor is connected with the first electrode of the driving transistor; a gate electrode of the second light-emitting control transistor is connected with the light-emitting control signal line, a first electrode of the second light-emitting control transistor is connected with the second electrode of the driving transistor, and a second electrode of the second light-emitting control transistor is connected with the first electrode of the light-emitting element.

At least one embodiment of the disclosure further provides a display device comprising the display panel according to any one of items as mentioned above.

In another aspect, at least one embodiment of the disclosure provides a display panel, comprising: a base substrate; a pixel unit, located on the base substrate and comprising a pixel circuit and a light-emitting element, the pixel circuit being configured to drive the light-emitting element, the pixel circuit being closer to the base substrate than the light-emitting element, the pixel circuit comprising a driving transistor; a data line, configured to provide a data signal to the pixel circuit; a connection element, the light-emitting element being connected with the pixel circuit through the connection element, the connection element comprising a shielding portion; and a connection line, connected with a gate electrode of the driving transistor, wherein the data line comprises two adjacent data lines, the shielding portion is located between the two adjacent data lines, an orthographic projection of the connection line on the base substrate at least partially overlaps with an orthographic projection of the shielding portion on the base substrate.

For example, in some embodiments of the disclosure, the orthographic projection of the shielding portion on the base substrate is larger than the orthographic projection of the connection line on the base substrate.

For example, in some embodiments of the disclosure, an orthographic projection of the gate electrode of the driving transistor on the base substrate overlaps with the orthographic projection of the shielding portion on the base substrate, an area of an overlapping portion of the shielding portion and the gate electrode of the driving transistor is smaller than an area of the gate electrode of the driving transistor.

For example, in some embodiments of the disclosure, the two adjacent data lines are arranged along a first direction, and the data lines extend along a second direction.

For example, in some embodiments of the disclosure, a size of the gate electrode of the driving transistor in the first direction is larger than a size of the shielding portion in the first direction; a size of the shielding portion in the second direction is larger than a size of the gate electrode of the driving transistor in the second direction.

For example, in some embodiments of the disclosure, the connection line is in contact with the gate electrode of the driving transistor.

For example, in some embodiments of the disclosure, the date line and the shielding portion are located in the same layer, an extending direction of the shielding portion and an extending direction of the data line are the same.

For example, in some embodiments of the disclosure, the display panel further comprises a first conductive structure, wherein the connection line is connected with the first conductive structure, the orthographic projection of the shielding portion on the base substrate at least partially overlaps with an orthographic projection of the first conductive structure on the base substrate.

For example, in some embodiments of the disclosure, the pixel circuit further comprises a first reset transistor, a second electrode of the first reset transistor is connected with the gate electrode of the driving transistor, and the first conductive structure is multiplexed as the second electrode of the first reset transistor.

For example, in some embodiments of the disclosure, the display panel further comprises a first reset control signal line and a first initialization signal line, wherein a gate electrode of the first reset transistor is connected with the first reset control signal line, a first electrode of the first reset transistor is connected with the first initialization signal line.

For example, in some embodiments of the disclosure, the first reset transistor comprises a first channel and a second channel, the first channel and the second channel of the first reset transistor are connected through a conductive connection portion, the orthographic projection of the shielding portion on the base substrate overlaps with an orthographic projection of the conductive connection portion of the first rest transistor on the base substrate.

For example, in some embodiments of the disclosure, the display panel further comprises a second initialization signal line, wherein the first initialization signal line and the second initialization signal line are respectively located at two opposite sides of the gate electrode of the driving transistor, the orthographic projection of the shielding portion on the base substrate partially overlaps with an orthographic projection of the second initialization signal line on the base substrate.

For example, in some embodiments of the disclosure, the display panel further comprises a first power line and a blocker, wherein the first power line is configured to supply a first power supply voltage to the pixel circuit, the blocker is electrically connected with the first power line, an orthographic projection of the first conductive structure on the base substrate at least partially overlaps with an orthographic projection of the blocker on the base substrate.

For example, in some embodiments of the disclosure, the display panel further comprises a second conductive structure, the data line is connected with the second conductive structure, the orthographic projection of the blocker on the base substrate at least partially overlaps with an orthographic projection of the second conductive structure on the base substrate.

For example, in some embodiments of the disclosure, the display panel further comprises a gate line, wherein the gate line and the data line cross with each other and are insulated from each other, the gate line is configured to supply a scanning signal to the pixel circuit, the pixel circuit further comprises a threshold compensation transistor, a first electrode of the threshold compensation transistor is connected with a second electrode of the driving transistor, a second electrode of the threshold compensation transistor is connected with the gate electrode of the driving transistor; a gate electrode of the threshold compensation transistor is connected with the gate line; the gate electrode of the driving transistor is connected with the second electrode of the threshold compensation transistor through the connection line, the threshold compensation transistor comprises a first channel and a second channel, and the first channel and the second channel are connected by a conductive connection portion; an orthographic projection of the blocker on the base substrate at least partially overlaps with an orthographic projection of the conductive connection portion of the threshold compensation transistor on the base substrate.

For example, in some embodiments of the disclosure, an area of an orthographic projection of a portion of the blocker overlapping with the first conductive structure on the base substrate is larger than an area of an orthographic projection of a portion of the blocker overlapping with the conductive connection portion of the threshold compensation transistor on the base substrate.

For example, in some embodiments of the disclosure, a material of the first conductive structure is different from a material of the connection line.

For example, in some embodiments of the disclosure, the pixel unit comprises two adjacent pixel units located in the same column, the two adjacent data lines are respectively connected with the two adjacent pixel units.

For example, in some embodiments of the disclosure, the display panel further comprises a second reset control signal line, the pixel circuit further comprises a second reset transistor, a gate electrode of the second reset transistor is connected with the second reset control signal line, a first electrode of the second reset transistor is connected with the second initialization signal line, and a second electrode of the second reset transistor is connected with a first electrode of the light-emitting element.

For example, in some embodiments of the disclosure, the pixel circuit further comprises a first power supply terminal and a storage capacitor, a first electrode of the storage capacitor is connected with the gate electrode of the driving transistor, a second electrode of the storage capacitor is connected with the first power supply terminal.

For example, in some embodiments of the disclosure, the pixel circuit further comprises a data writing transistor, a gate electrode of the data writing transistor is connected with the gate line, a first electrode of the data writing transistor is connected with the data line, and a second electrode of the data writing transistor is connected with a first electrode of the driving transistor.

For example, in some embodiments of the disclosure, the display panel further comprises a light-emitting control signal line, the pixel circuit further comprises a first light-emitting control transistor and a second light-emitting control transistor, a gate electrode of the first light-emitting control transistor is connected with the light-emitting control signal line, a first electrode of the first light-emitting control transistor is connected with the first power supply terminal, and a second electrode of the first light-emitting control transistor is connected with the first electrode of the driving transistor; a gate electrode of the second light-emitting control transistor is connected with the light-emitting control signal line, a first electrode of the second light-emitting control transistor is connected with the second electrode of the driving transistor, and a second electrode of the second light-emitting control transistor is connected with the first electrode of the light-emitting element.

For example, in some embodiments of the disclosure, the data line includes a first portion and a second portion, a distance between first portions of two adjacent data lines is larger than a distance between second portions of two adjacent data lines, the shielding portion is located between the second portions of two adjacent data lines.

For example, in some embodiments of the disclosure, the second portions of two adjacent data lines are respectively close to the first light-emitting control transistor and the second light-emitting control transistor, the storage capacitor is located between the first portions of two adjacent data lines.

For example, in some embodiments of the disclosure, the connection element further comprises a connection electrode, the connection electrode is connected with the pixel circuit, and the light-emitting element is connected with the connection electrode through the shielding portion.

At least one embodiment of the disclosure further provides a display device comprising the display panel according to any items as mentioned above.

BRIEF DESCRIPTION OF THE DRAWINGS

In order to more clearly explain the technical solution of the embodiments of the present disclosure, drawings of the embodiments will be briefly introduced in the following. Obviously, the drawings in the following description only relate to some embodiments of the present disclosure, but not limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

At present, there is a great demand for high frame rate AMOLED display panels in the market. For example, a dual data scheme can achieve 120 Hz driving while ensuring the display effect.

Figure 1:
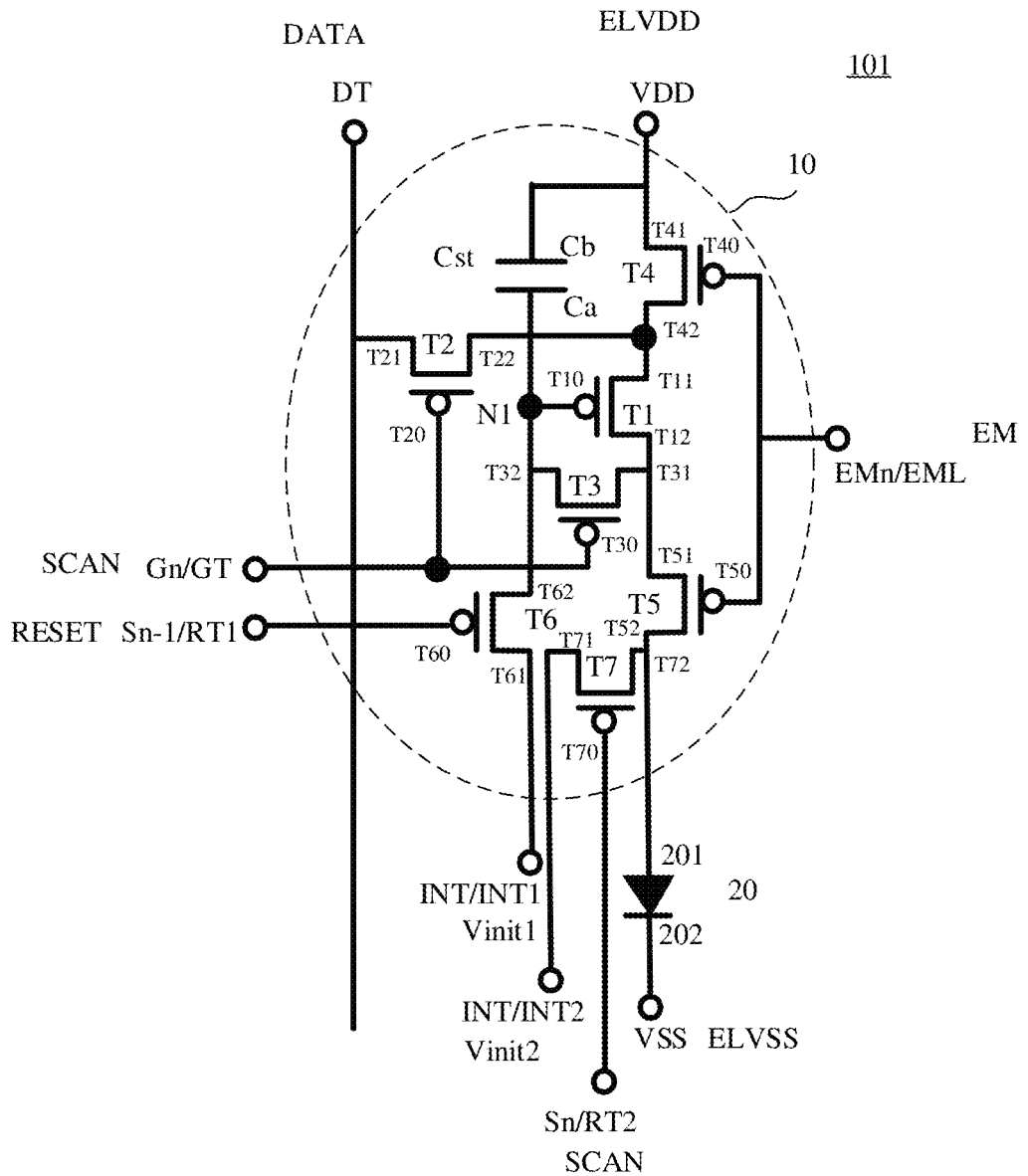
FIG. 1 is a schematic diagram of a 7T1C pixel circuit.
Figure 2:
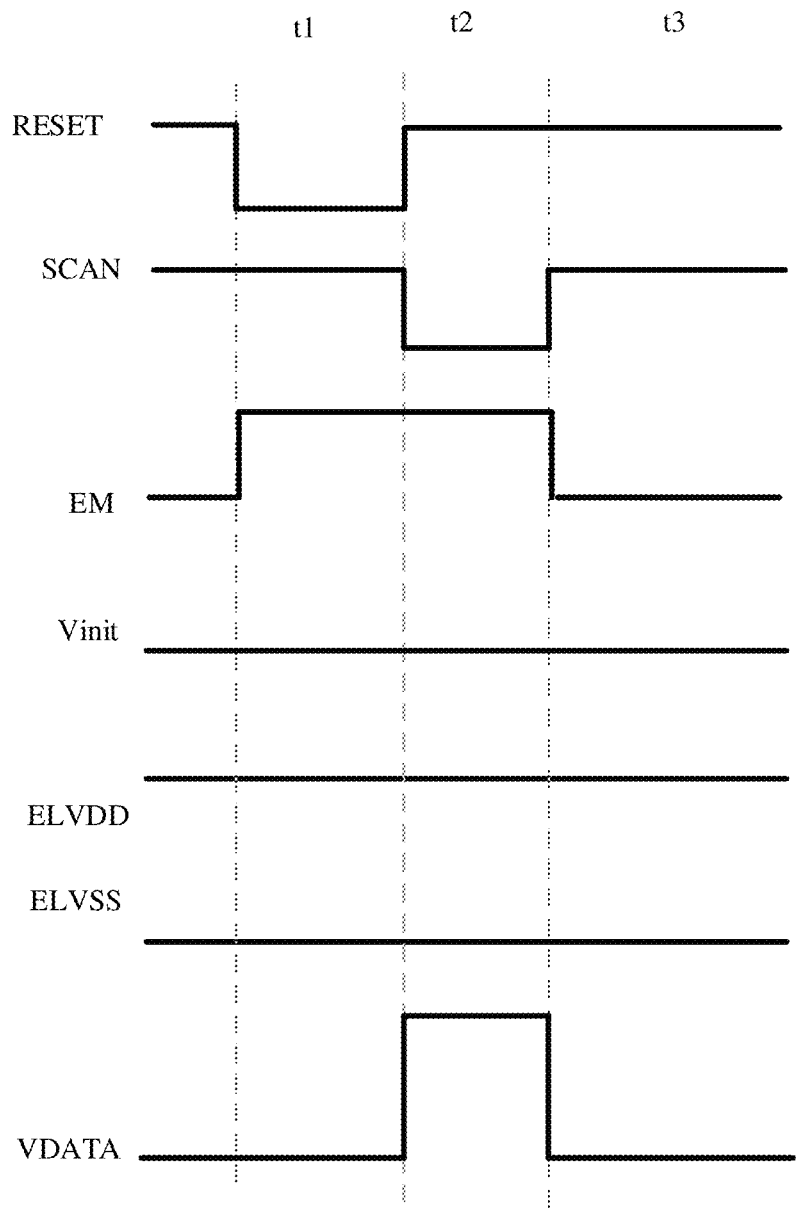
FIG. 2 is an operation sequence diagram of a pixel circuit shown in FIG. 1.

FIG. 1 is a schematic diagram of a 7T1C pixel circuit. FIG. 2 is an operation sequence diagram of the pixel circuit shown in FIG. 1. The pixel circuit shown in FIG. 1 can be a pixel circuit of a low temperature poly-silicon (LTPS) AMOLED that is commonly used in related art.

FIG. 1 shows a pixel circuit of a pixel unit of a display panel. As illustrated by FIG. 1, the pixel unit 101 includes a pixel circuit 10 and a light-emitting element 20. The pixel circuit 10 includes six switching transistors (T2-T7), a driving transistor T1 and a storage capacitor Cst. The six switching transistors are a data writing transistor T2, a threshold compensation transistor T3, a first light-emitting control transistor T4, a second light-emitting control transistor T5, a first reset transistor T6, and a second reset transistor T7. The light-emitting element 20 includes a first electrode 201 and a second electrode 202 and a light-emitting functional layer located between the first electrode 201 and the second electrode 202. For example, the first electrode 201 is an anode and the second electrode 202 is a cathode. Generally, the threshold compensation transistor T3 and the first reset transistor T6 adopt a double-gate TFT to reduce current leakage.

As illustrated by FIG. 1, the display panel includes a gate line GT, a data line DT, a first power supply terminal VDD, a second power supply terminal VSS, a light-emitting control signal line EML, an initialization signal line INT, a first reset control signal line RT1, a second reset control signal line RT2, and the like. The first power supply terminal VDD is configured to provide a constant first voltage signal ELVDD to the pixel unit 101, and the second power supply terminal VSS is configured to provide a constant second voltage signal ELVSS to the pixel unit 101, and the first voltage signal ELVDD is larger than the second voltage signal ELVSS. The gate line GT is configured to provide a scanning signal SCAN to the pixel unit 101, the DATA line DT is configured to provide a data signal DATA (data voltage VDATA) to the pixel unit 101, the light-emitting control signal line EML is configured to provide a light-emitting control signal EM to the pixel unit 101, the first reset control signal line RT1 is configured to provide a reset control signal RESET to the pixel unit 101, the second reset control signal line RT2 is configured to provide a scan signal SCAN to the pixel unit 101, and the initialization signal line INT is configured to provide an initialization signal Vinit to the pixel unit 101. For example, the initialization signal Vinit is a constant voltage signal, and its magnitude can be between the first voltage signal ELVDD and the second voltage signal ELVSS, but is not limited thereto. For example, the initialization signal Vinit can be greater than or equal to the second voltage signal ELVSS. For example, the initialization signal line INT includes a first initialization signal line INT1 and a second initialization signal line INT2. For example, the first initialization signal line INT1 is configured to provide an initialization signal Vinit1 to the pixel unit 101, and the second initialization signal line INT2 is configured to provide an initialization signal Vinit2 to the pixel unit 101. For example, in some embodiments, the first initialization signal Vinit1 and the second initialization signal Vinit2 are equal to each other and both are Vinit.

As illustrated by FIG. 1, the driving transistor T1 is electrically connected with the light-emitting element 20, and outputs a driving current to drive the light-emitting element 20 to emit light under the control of a scan signal SCAN, a data signal DATA, a first voltage signal ELVDD, a second voltage signal ELVSS, and the like.

For example, the light-emitting element 20 is an organic light-emitting diode (OLED), and the light-emitting element 20 emits red light, green light, blue light, or white light driven by a corresponding pixel circuit 10 of the light-emitting element 20. For example, a pixel includes a plurality of pixel units. A pixel may include a plurality of pixel units emitting light of different colors. For example, a pixel includes a pixel unit emitting red light, a pixel unit emitting green light and a pixel unit emitting blue light, but the present disclosure is not limited thereto. The number of pixel units included in a pixel and the light-emitting condition of each pixel unit can be determined as required.

For example, as illustrated by FIG. 1, a gate electrode T20 of the data writing transistor T2 is connected with the gate line GT, a first electrode T21 of the data writing transistor T2 is connected with the data line DT, and a second electrode T22 of the data writing transistor T2 is connected with a first electrode T11 of the driving transistor T1.

For example, as illustrated by FIG. 1, the pixel circuit 10 further includes a threshold compensation transistor T3, a gate electrode T30 of the threshold compensation transistor T3 is connected with the gate line GT, a first electrode T31 of the threshold compensation transistor T3 is connected with the second electrode T12 of the driving transistor T1, and a second electrode T32 of the threshold compensation transistor T3 is connected with a gate electrode T10 of the driving transistor T1.

For example, as illustrated by FIG. 1, the display panel further includes a light-emitting control signal line EML, and the pixel circuit 10 further includes a first light-emitting control transistor T4 and a second light-emitting control transistor T5. A gate electrode T40 of the first light-emitting control transistor T4 is connected with the light-emitting control signal line EML, a first electrode T41 of the first light-emitting control transistor T4 is connected with the first power supply terminal VDD, and a second electrode T42 of the first light-emitting control transistor T4 is connected with the first electrode T11 of the driving transistor T1. A gate electrode T50 of the second light-emitting control transistor T5 is connected with the light-emitting control signal line EML, a first electrode T51 of the second light-emitting control transistor T5 is connected with the second electrode T12 of the driving transistor T1, and a second electrode T52 of the second light-emitting control transistor T5 is connected with the first electrode 201 of the light-emitting element 20.

As illustrated by FIG. 1, the first reset transistor T6 is connected with the gate electrode T10 of the driving transistor T1 and configured to reset the gate electrode of the driving transistor T1, and the second reset transistor T7 is connected with the first electrode 201 of the light-emitting element 20 and configured to reset the first electrode 201 of the light-emitting element 20. The first initialization signal line INT1 is connected with the gate electrode of the driving transistor T1 through the first reset transistor T6. The second initialization signal line INT2 is connected with the first electrode 201 of the light-emitting element 20 through the second reset transistor T7. For example, the first initialization signal line INT1 and the second initialization signal line INT2 are connected, and input with the same initialization signal, but the embodiments of the present disclosure are not limited thereto. In some embodiments, the first initialization signal line INT1 and the second initialization signal line INT2 may also be insulated from each other and configured to be input with signals separately.

For example, as illustrated by FIG. 1, the first electrode T61 of the first reset transistor T6 is connected with the first initialization signal line INT1, the second electrode T62 of the first reset transistor T6 is connected with the gate electrode T10 of the driving transistor T1, the first electrode T71 of the second reset transistor T7 is connected with the second initialization signal line INT2, and the second electrode T72 of the second reset transistor T7 is connected with the first electrode 201 of the light-emitting element 20. For example, as illustrated by FIG. 1, the gate electrode T60 of the first reset transistor T6 is connected with the first reset control signal line RT1, and the gate electrode T70 of the second reset transistor T7 is connected with the second reset control signal line RT2.

As illustrated by FIG. 1, the first power supply terminal VDD is configured to provide a first voltage signal ELVDD to the pixel circuit 10; the pixel circuit also includes a storage capacitor Cst, a first electrode Ca of the storage capacitor Cst is connected with the gate electrode T10 of the driving transistor T1, and the second electrode Cb of the storage capacitor Cst is connected with the first power supply terminal VDD.

For example, as illustrated by FIG. 1, the display panel further includes a second power supply terminal VSS, which is connected with the second electrode 201 of the light-emitting element 20.

As illustrated by FIG. 2, in a frame display period, the driving method of the pixel unit includes a first reset phase t1, a data writing, threshold compensation and second reset phase t2, and a light-emitting phase t3. Upon the reset control signal RESET being at a low level, the gate electrode of the driving transistor T1 is reset, and upon the scan signal SCAN being at a low level, the first electrode 201 (for example, an anode) of the light-emitting element 20 is reset. For example, as illustrated by FIG. 1, in the case where the scan signal SCAN is at a low level, the data voltage VDATA is written, and the threshold voltage Vth of the driving transistor T1 is acquired at the same time, and the data voltage VDADA containing the data information on the data line is stored in the capacitor Cst; in the case where the light-emitting control signal line EML is at a low level, the light-emitting element 20 emits light, and the voltage of the first node N1 (the gate signal portion of the driving transistor) is maintained (the light emission stability of the light-emitting element 20) by the storage capacitor Cst. In the driving process of the pixel circuit 10, in the light-emitting phase, the storage capacitor is used to maintain the voltage signal, so that the potential of its signal holding terminal is kept constant, and a voltage is formed between the gate electrode and the source electrode of the driving transistor, thereby controlling the driving transistor to form a driving current, thereby driving the light-emitting element 20 to emit light.

As illustrated by FIG. 2, in the reset phase t1, the light-emitting control signal EM is set to the turn-off voltage, the reset control signal RESET is set to the turn-on voltage, and the scan signal SCAN is set to the turn-off voltage.

As illustrated by FIG. 2, in the data writing and threshold compensation phase and the second reset phase t2, the light-emitting control signal EM is set to the turn-off voltage, the reset control signal RESET is set to the turn-off voltage, and the scan signal SCAN is set to the turn-on voltage.

As illustrated by FIG. 2, in the light-emitting phase t3, the light-emitting control signal EM is set as the turn-on voltage, the reset control signal RESET is set as the turn-off voltage, and the scan signal SCAN is set as the turn-off voltage.

As illustrated by FIG. 2, both the first voltage signal ELVDD and the second voltage signal ELVSS are constant voltage signals. For example, the initialization signal Vinit is between the first voltage signal ELVDD and the second voltage signal ELVSS.

For example, the turn-on voltage in the embodiment of the present disclosure refers to a voltage that can conduct the first electrode and the second electrode of the corresponding transistors, and the turn-off voltage refers to a voltage that can disconnect the conducting path between the first electrode and the second electrode of the corresponding transistors. In the case where the transistor is a P-type transistor, the turn-on voltage is a low voltage (for example, 0V) and the turn-off voltage is a high voltage (for example, 5V). In the case where the transistor is an N-type transistor, the turn-on voltage is a high voltage (for example, 5V) and the turn-off voltage is a low voltage (for example, 0V). The driving waveforms shown in FIG. 2 are all explained by taking P-type transistors as an example. For example, the turn-on voltage is a low voltage (e.g., 0V) and the turn-off voltage is a high voltage (e.g., 5V), but the embodiments of the present disclosure are not limited thereto.

Referring to FIG. 1 and FIG. 2 together, in the first reset phase t1, the light-emitting control signal EM is the turn-off voltage, the reset control signal RESET is the turn-on voltage, and the scan signal SCAN is the turn-off voltage. In this case, the first reset transistor T6 is in an ON state, while the second reset transistor T7, the data writing transistor T2, the threshold compensation transistor T3, the first light-emitting control transistor T4 and the second light-emitting control transistor T5 are in an OFF state. The first reset transistor T6 transmits the first initialization signal (initialization voltage Vinit) ViniT1 to the gate electrode of the driving transistor T1 and is stored in the storage capacitor Cst, thereby resetting the driving transistor T1 and erasing the data stored in the last light emission (previous frame).

In the data writing, threshold compensation and second reset phase t2, the light-emitting control signal EM is the turn-off voltage, the reset control signal Reset is the turn-off voltage, and the scan signal SCAN is the turn-on voltage. In this case, the data writing transistor T2 and the threshold compensation transistor T3 are in an ON state, and the second reset transistor T7 is in an ON state, and the second reset transistor T7 transmits a second initialization signal (initialization voltage Vinit) Vinit2 to the first electrode 201 of the light-emitting element 20 to reset the light-emitting element 20. While the first light-emitting control transistor T4, the second light-emitting control transistor T5 and the first reset transistor T6 are in the OFF state. In this case, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, whereby the gate electrode of the driving transistor T1 can be charged. After the charging is completed, the gate voltage of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation on the gate voltage of the driving transistor T1 according to the scan signal SCAN. At this phase, the voltage difference across the storage capacitor Cst is ELVDD−VDATA−Vth.

In the light-emitting phase t3, the light-emitting control signal EM is a turn-on voltage, the reset control signal RESET is a turn-off voltage, and the scan signal SCAN is a turn-off voltage. The first light-emitting control transistor T4 and the second light-emitting control transistor T5 are in an ON state, while the data writing transistor T2, the threshold compensation transistor T3, the first reset transistor T6 and the second reset transistor T7 are in an OFF state. The first voltage signal ELVDD is transmitted to the first electrode of the driving transistor T1 through the first light-emitting control transistor T4, the gate voltage of the driving transistor T1 is kept at VDATA+Vth, and the light-emitting current I flows into the light-emitting element 20 through the first light-emitting control transistor T4, the driving transistor T1 and the second light-emitting control transistor T5, and the light-emitting element 20 emits light. That is, the first light-emitting control transistor T4 and the second light-emitting control transistor T5 receive the light-emitting control signal EM and control the light-emitting element 20 to emit light according to the light-emitting control signal EM. The light-emitting current I satisfies the following saturation current formula:

$$K(Vgs-Vth)^2=K(VDATA+Vth-ELVDD-Vth)^2=K(VDATA-ELVDD)^2$$

where, $$K = 0.5\mu_n Cox\frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and source electrode of the driving transistor T1 (that is, the first electrode of the driving transistor T1 in this embodiment).

It can be seen from the above formula that the current flowing through the light-emitting element 20 has nothing to do with the threshold voltage of the driving transistor T1. Therefore, the pixel circuit perfectly compensates the threshold voltage of the driving transistor T1.

For example, a ratio of the duration of the light-emitting phase t3 to the display period of one frame can be adjusted. In this way, the light-emitting brightness can be controlled by adjusting the ratio of the duration of the light-emitting phase t3 to the display period of one frame. For example, the ratio of the duration of the light-emitting phase t3 to one frame of display time can be adjusted by controlling the scanning driving circuit in the display panel or an additionally provided driving circuit.

For example, the embodiments of the present disclosure are not limited to the specific pixel circuit shown in FIG. 1, and other pixel circuits that can realize compensation on the driving transistor can be adopted. Based on the description and teaching of this implementation in the present disclosure, other settings that can be easily thought of by ordinary skilled in this field without making creative work belong to the protection scope of the present disclosure.

Figure 3:
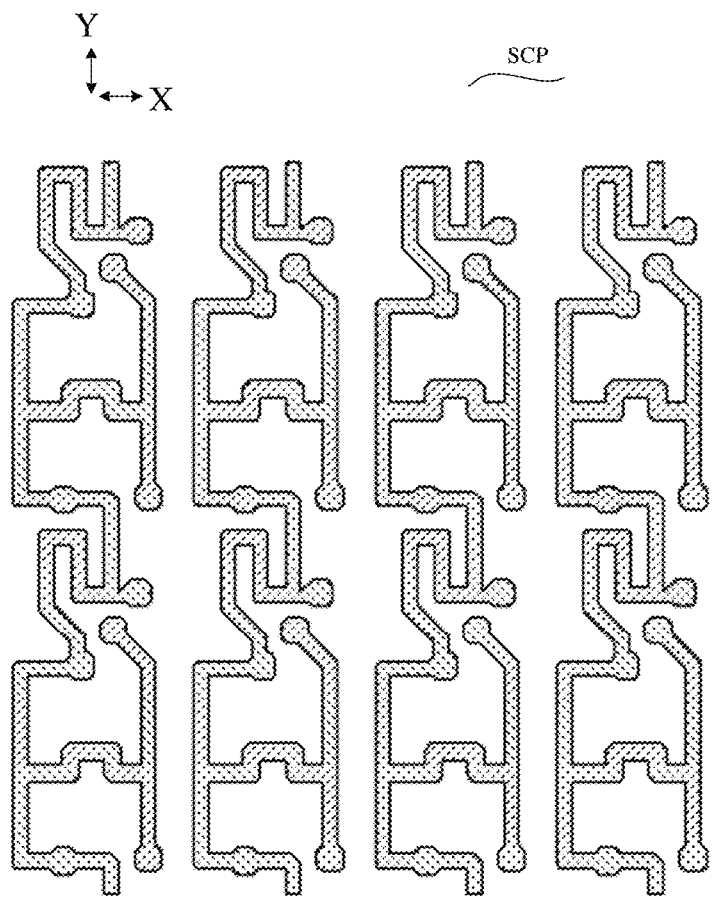
FIG. 3 is a plan view of a semiconductor pattern in a display panel according to an embodiment of the present disclosure.
Figure 4:
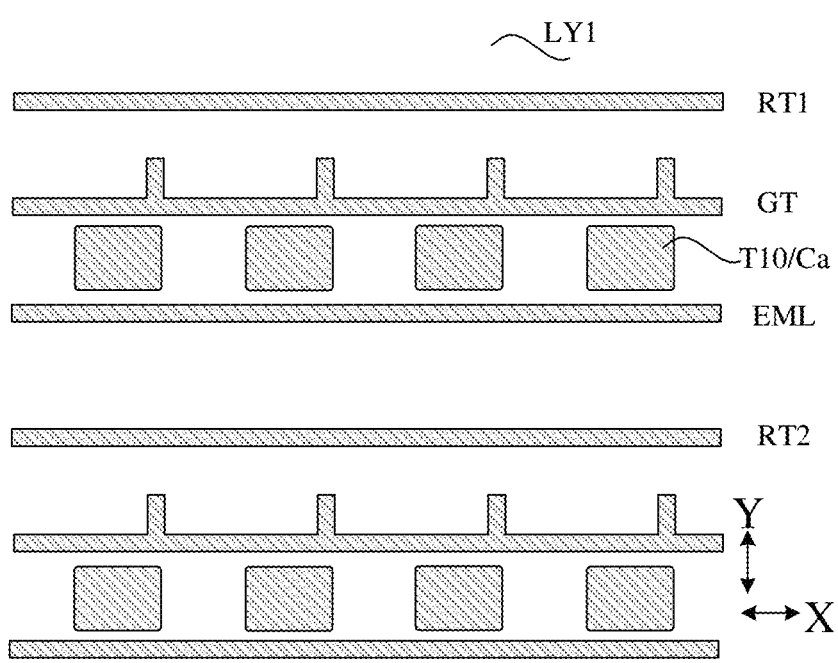
FIG. 4 is a plan view of a first conductive pattern layer in a display panel according to an embodiment of the present disclosure.
Figure 5:
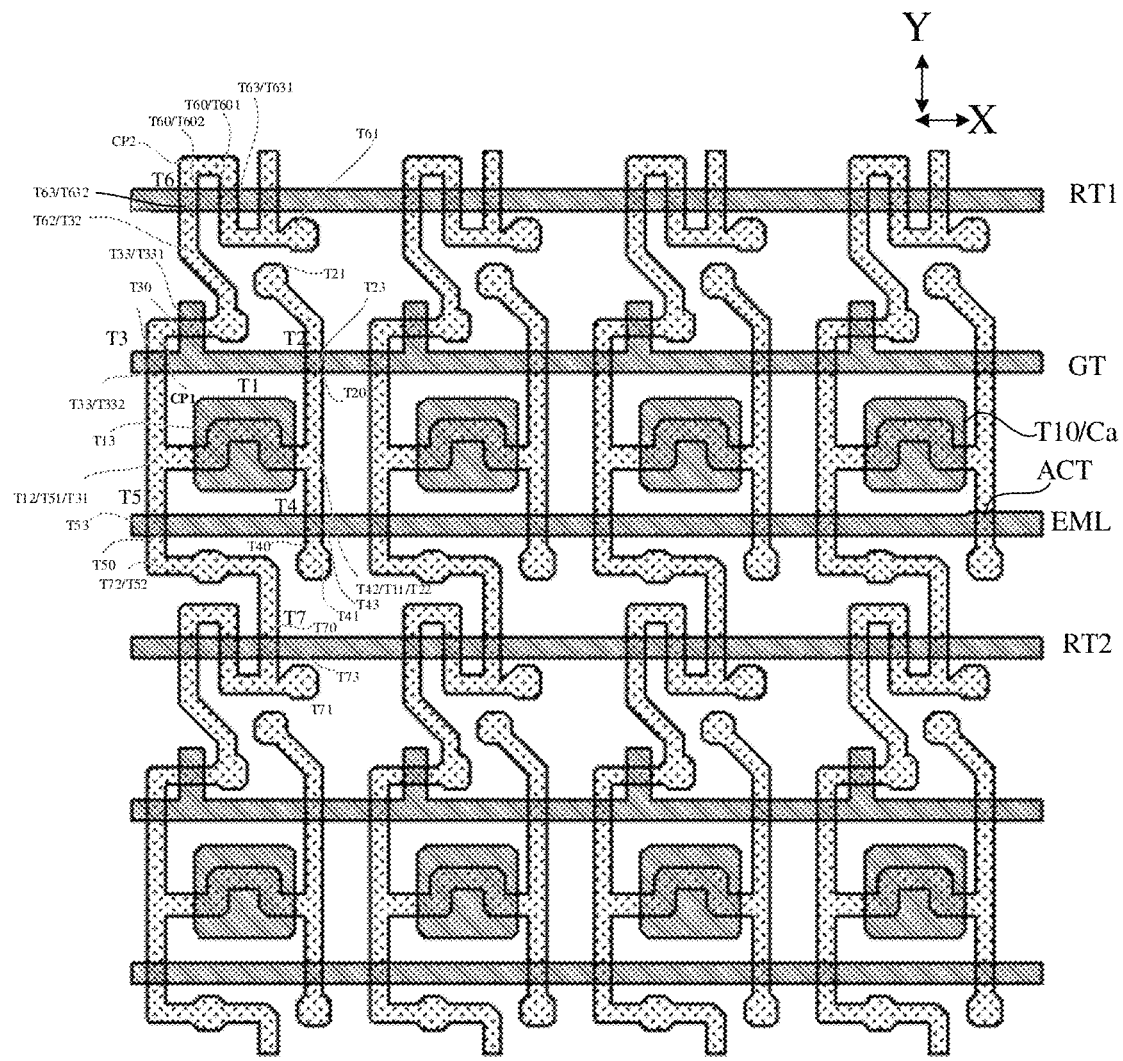
FIG. 5 is a schematic diagram of forming an active layer, a source electrode and a drain electrode of a thin film transistor in a display panel according to an embodiment of the present disclosure.
Figure 6:
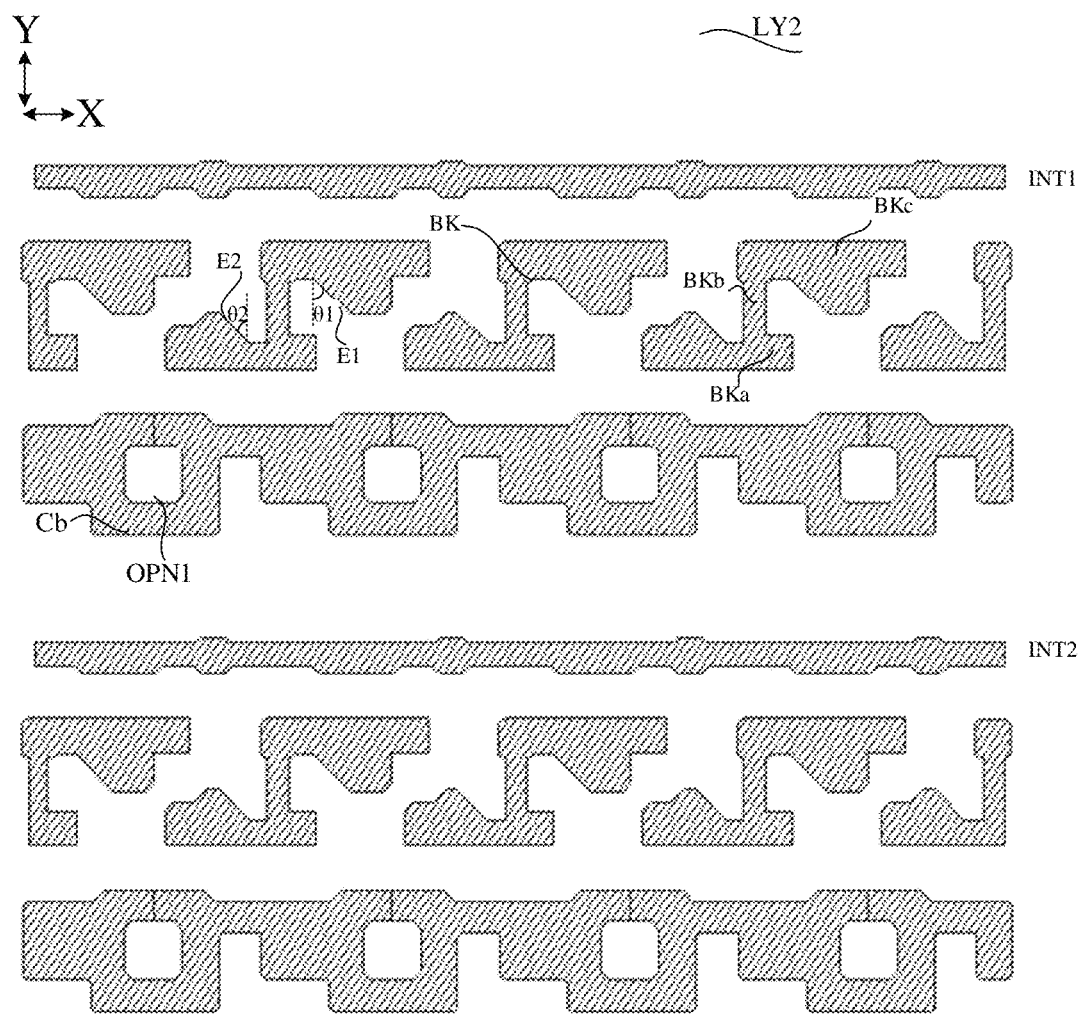
FIG. 6 is a plan view of a second conductive pattern layer in a display panel according to an embodiment of the present disclosure.
Figure 7:
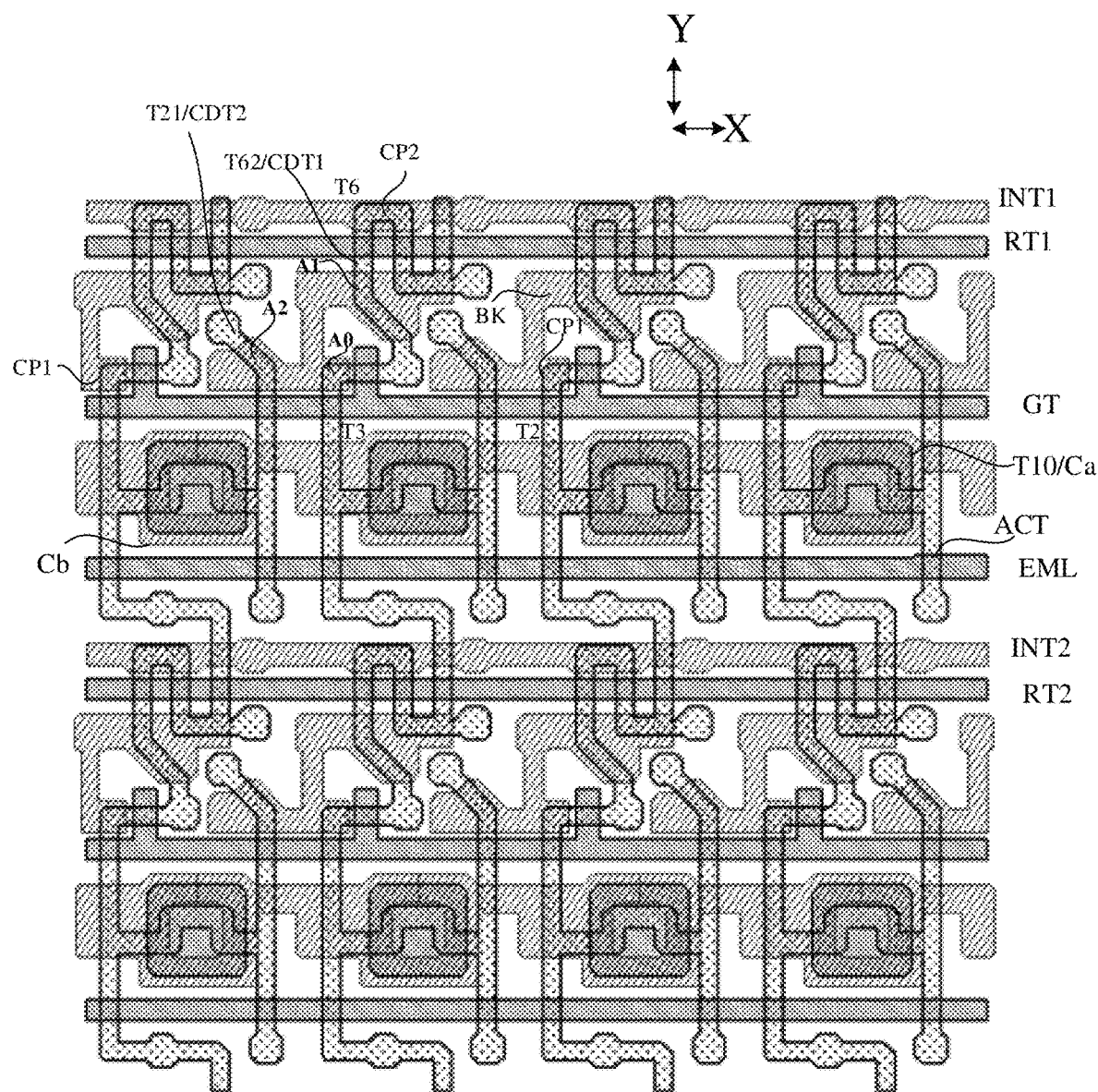
FIG. 7 is a schematic plan view of a display panel after forming a second conductive pattern layer according to an embodiment of the present disclosure.
Figure 8:
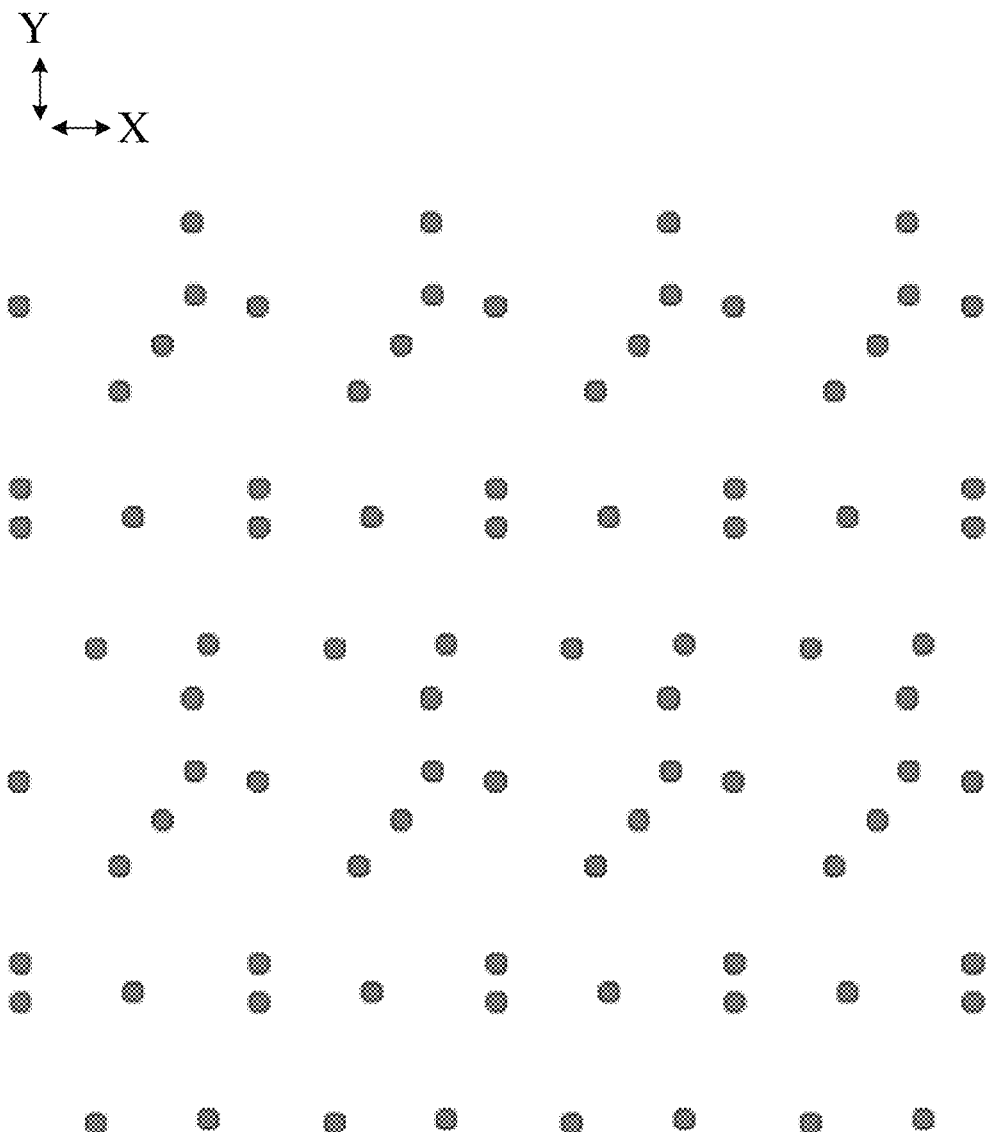
FIG. 8 is a schematic plan view of a via hole formed in at least one of a first gate insulating layer, a second gate insulating layer and an interlayer insulating layer in a display panel according to an embodiment of the present disclosure.
Figure 9:
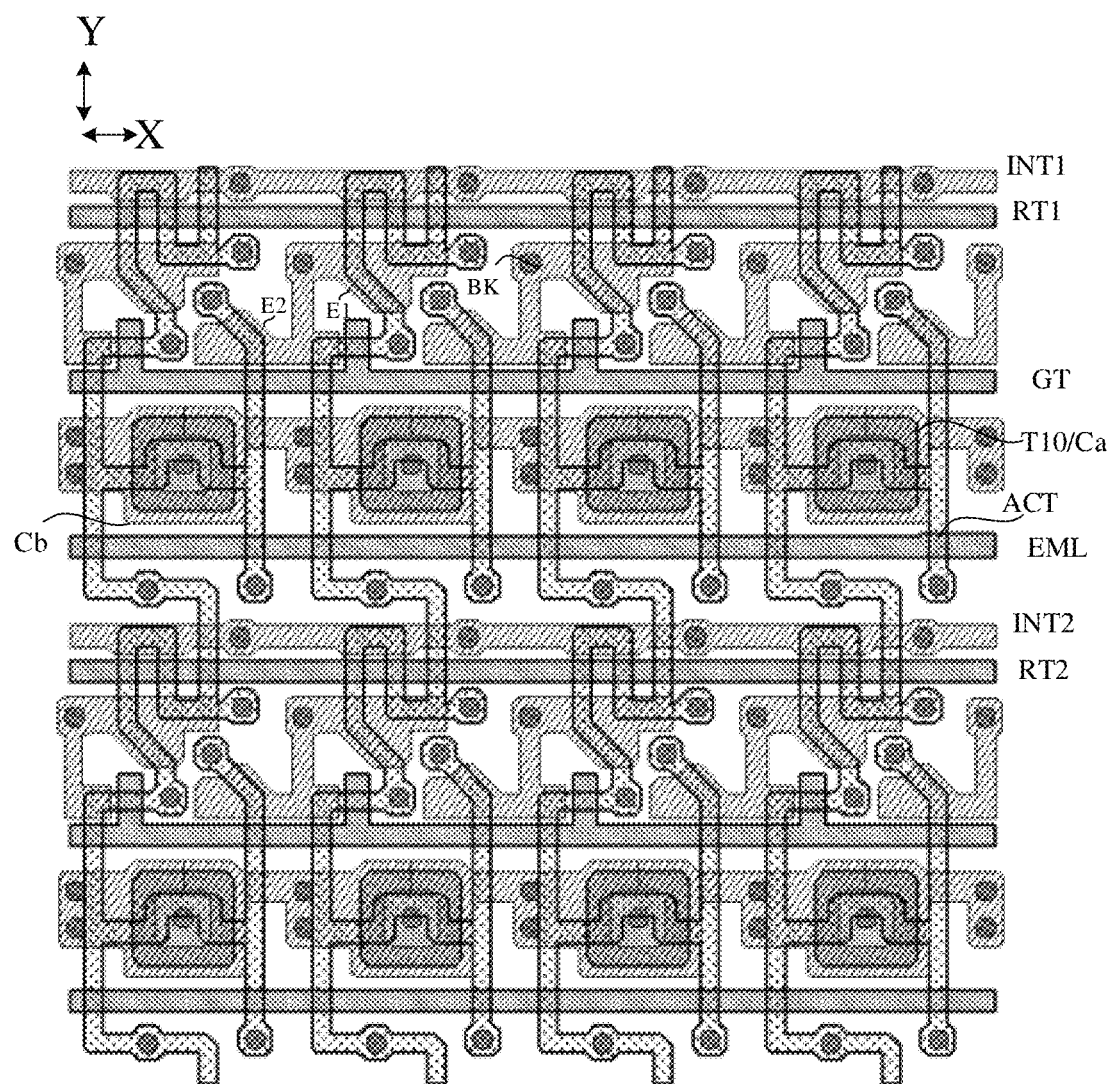
FIG. 9 is a schematic plan view of a display panel after a via hole being formed in at least one of a first gate insulating layer, a second gate insulating layer and an interlayer insulating layer according to an embodiment of the present disclosure.
Figure 10:
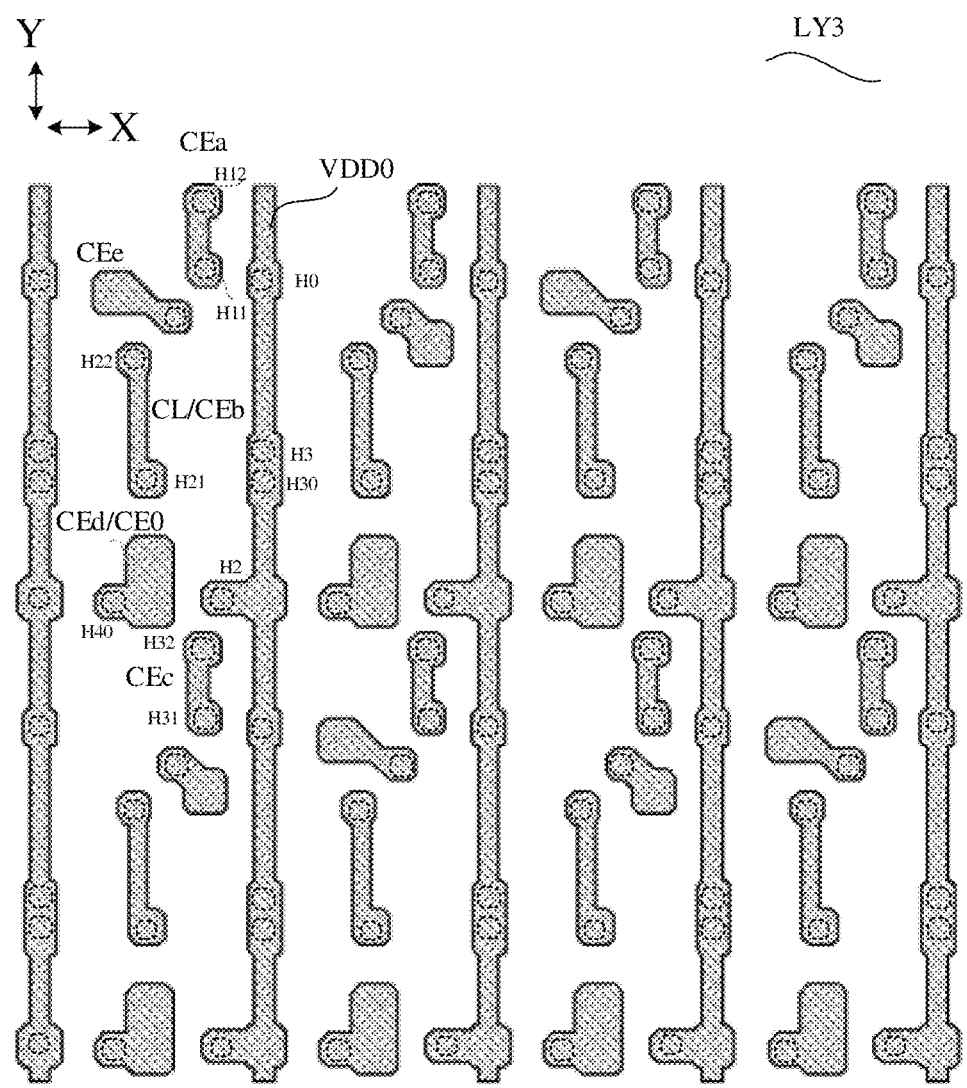
FIG. 10 is a plan view of a third conductive pattern layer in a display panel according to an embodiment of the present disclosure.
Figure 11:
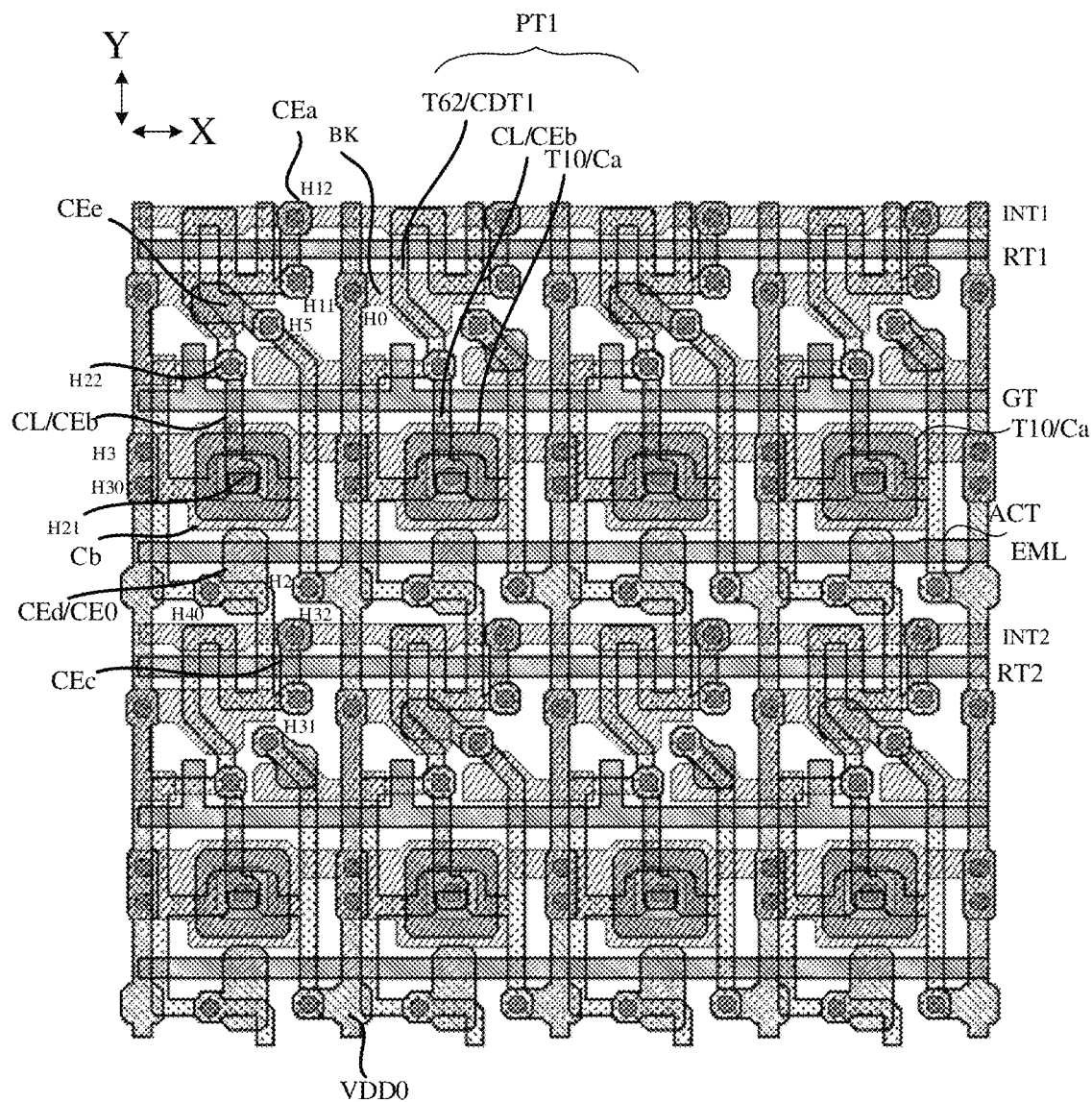
FIG. 11 is a plan view after forming a third conductive pattern layer in a display panel according to an embodiment of the present disclosure.
Figure 12:
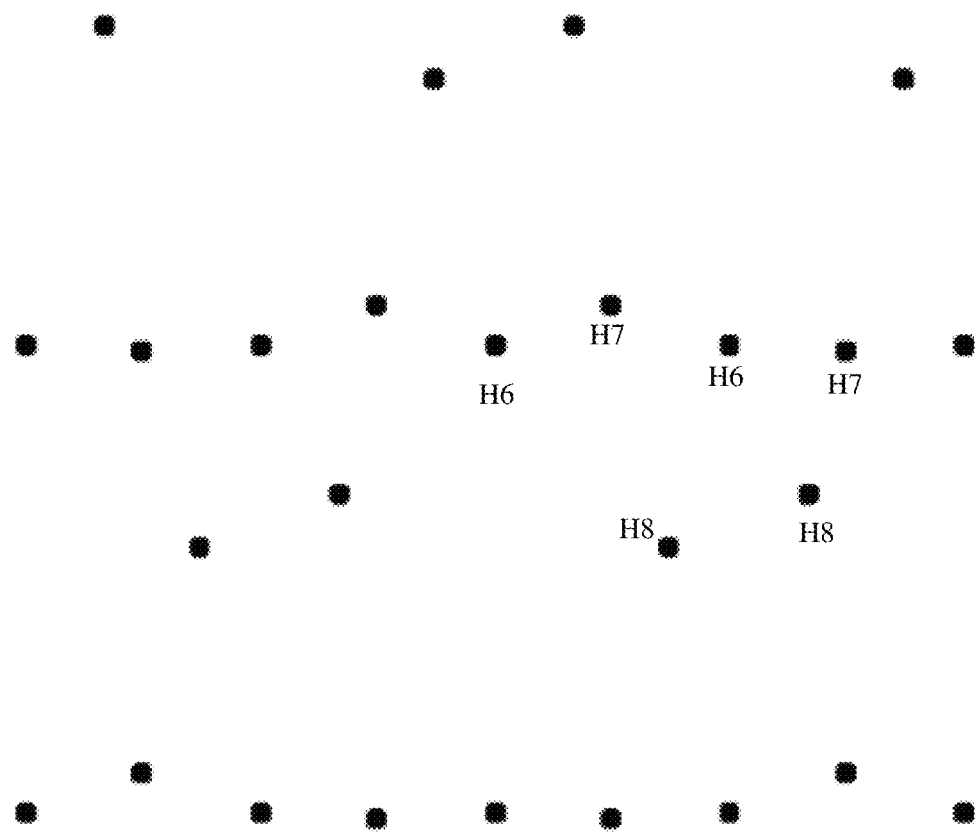
FIG. 12 is a schematic plan view of via holes formed in a passivation layer and a first planarization layer in a display panel according to an embodiment of the present disclosure.
Figure 13:
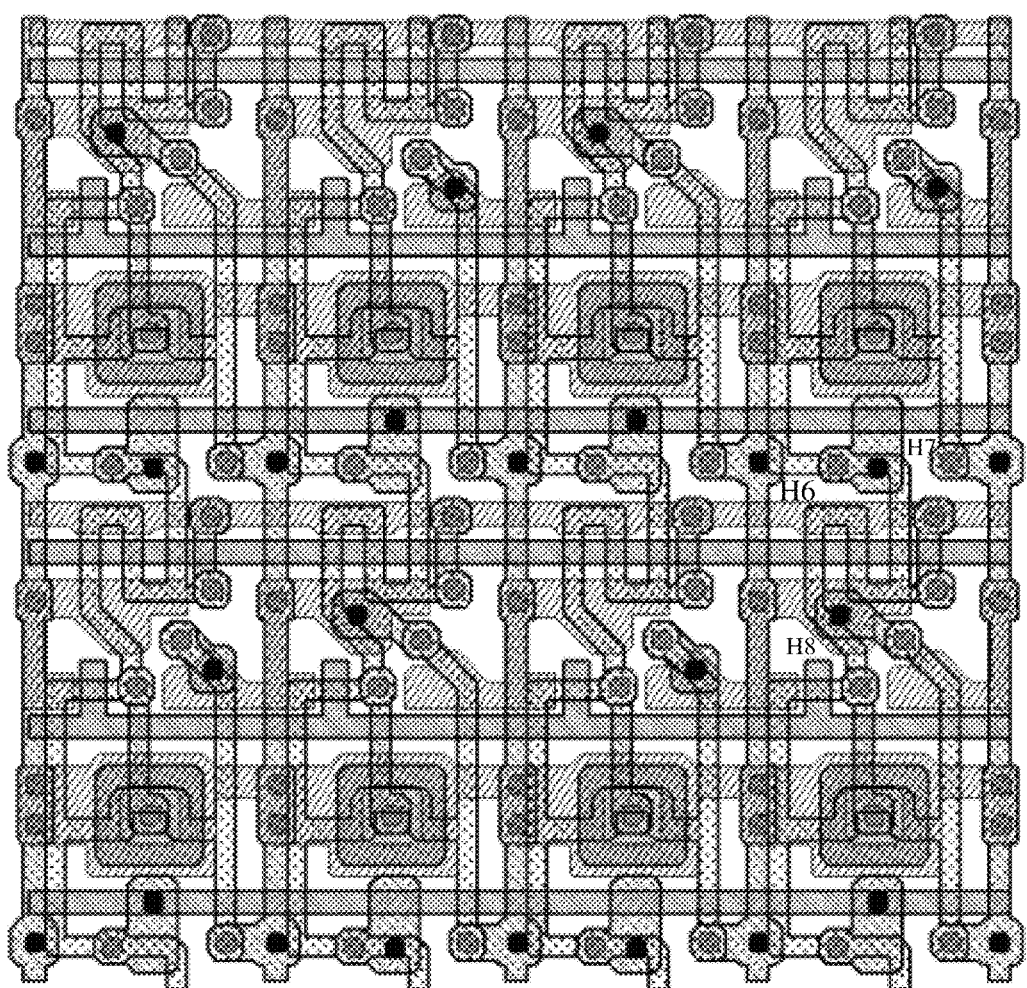
FIG. 13 is a schematic plan view of a display panel after via holes being formed in a passivation layer and a first planarization layer according to an embodiment of the present disclosure.
Figure 14:
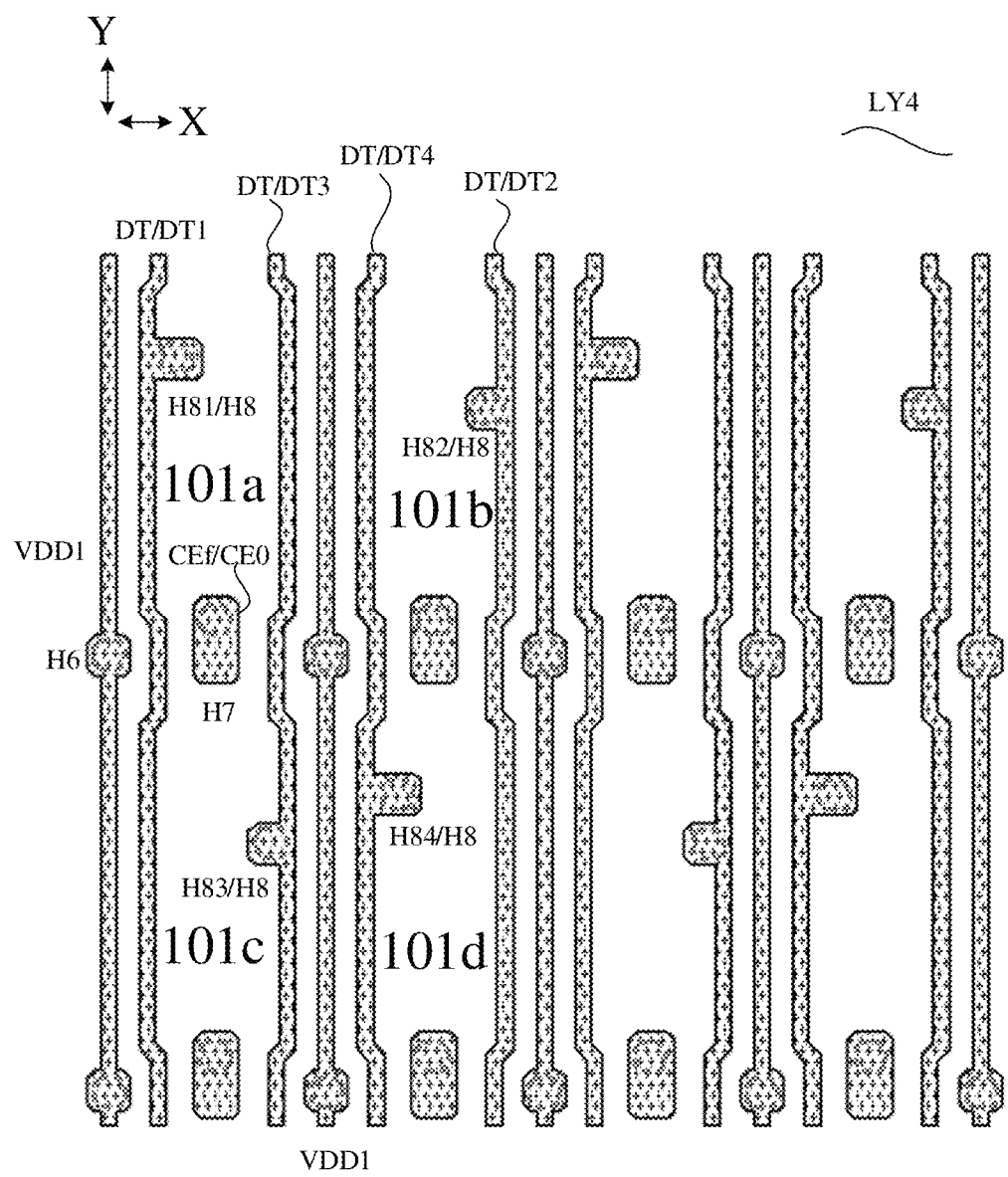
FIG. 14 is a plan view of a fourth conductive pattern layer in a display panel according to an embodiment of the present disclosure.
Figure 15:
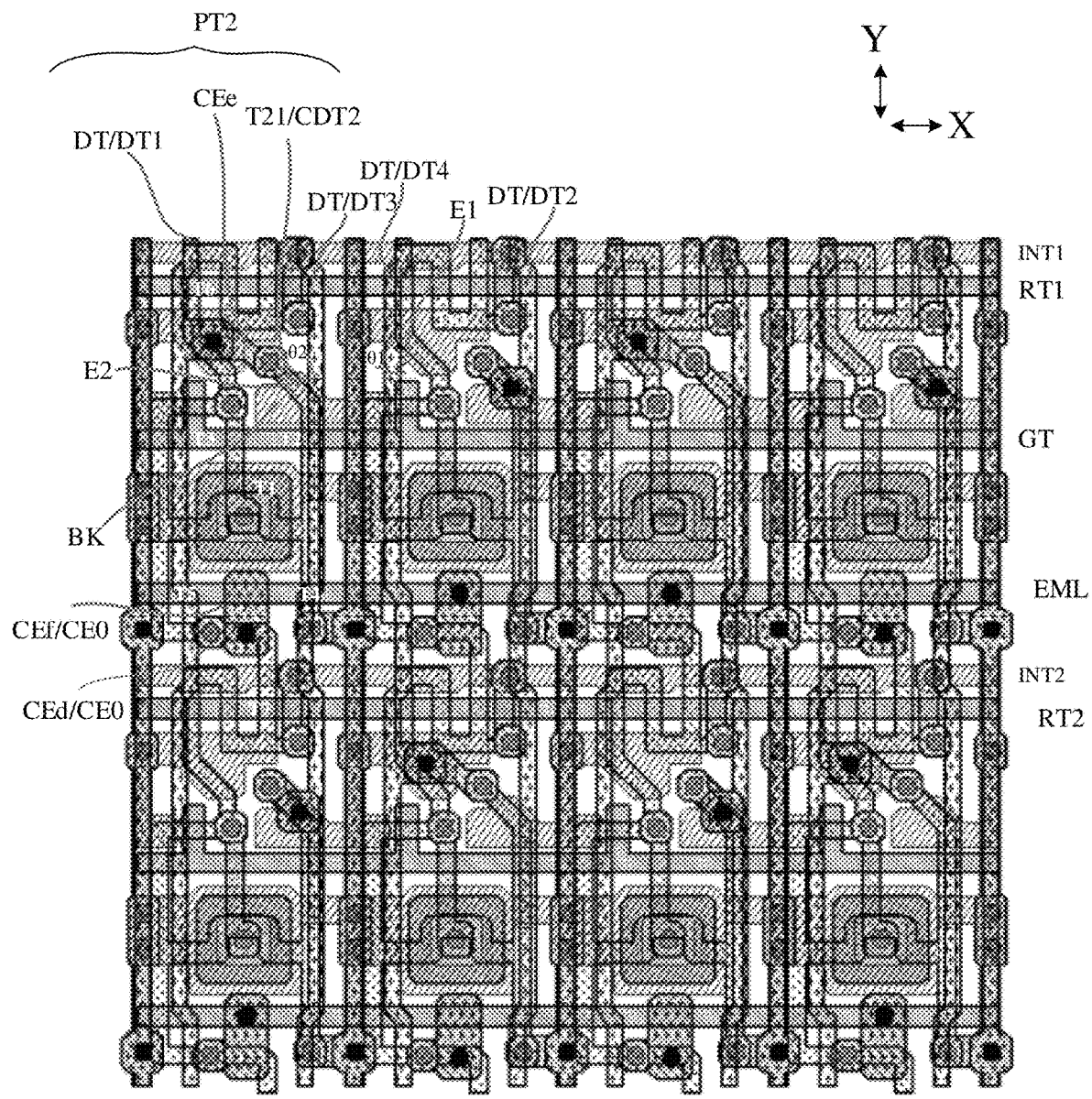
FIG. 15 is a schematic plan view of a display panel after forming a fourth conductive pattern layer according to an embodiment of the present disclosure.
Figure 16A:
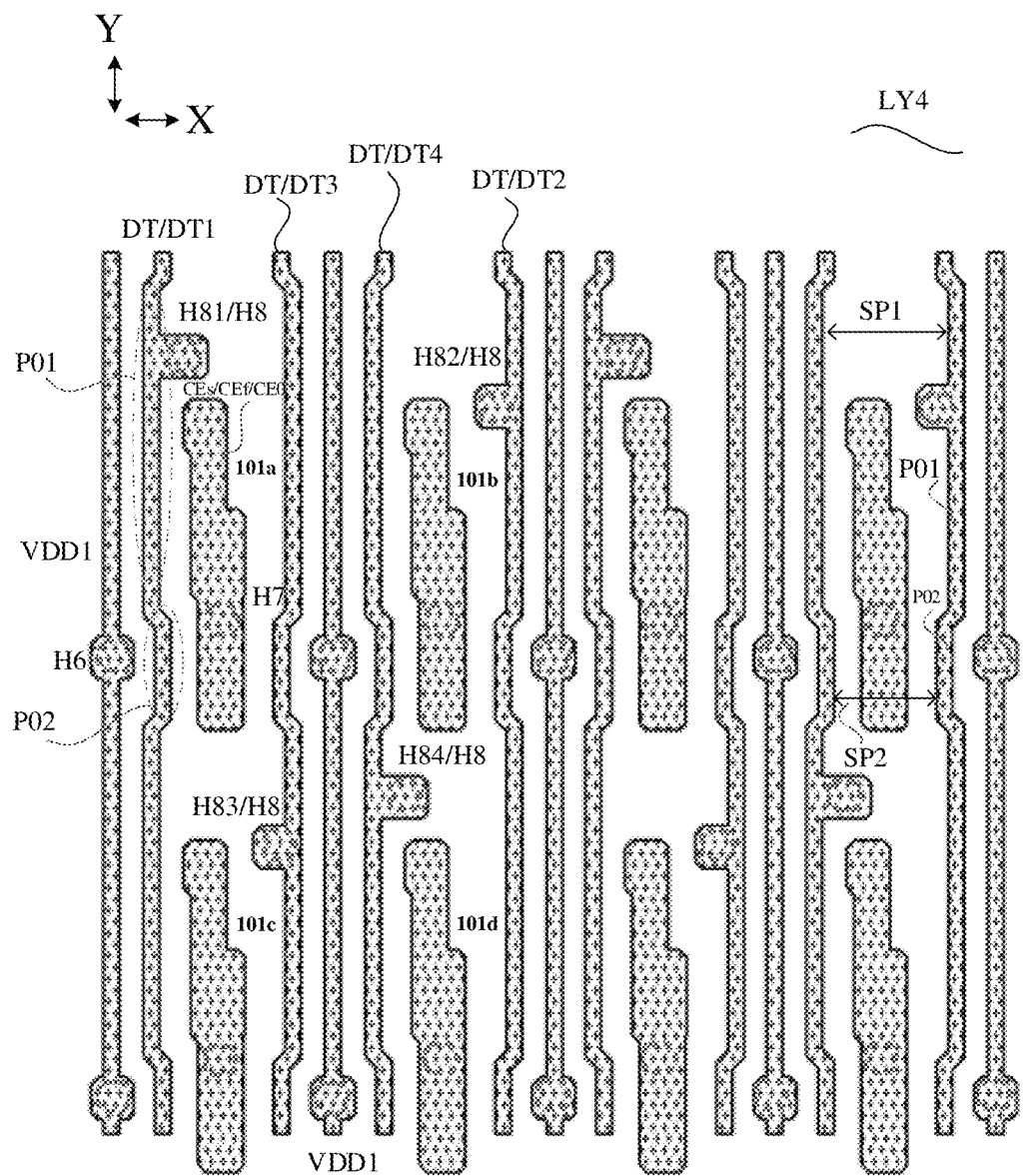
FIG. 16A is a plan view of a fourth conductive pattern layer in a display panel according to an embodiment of the present disclosure.
Figure 17:
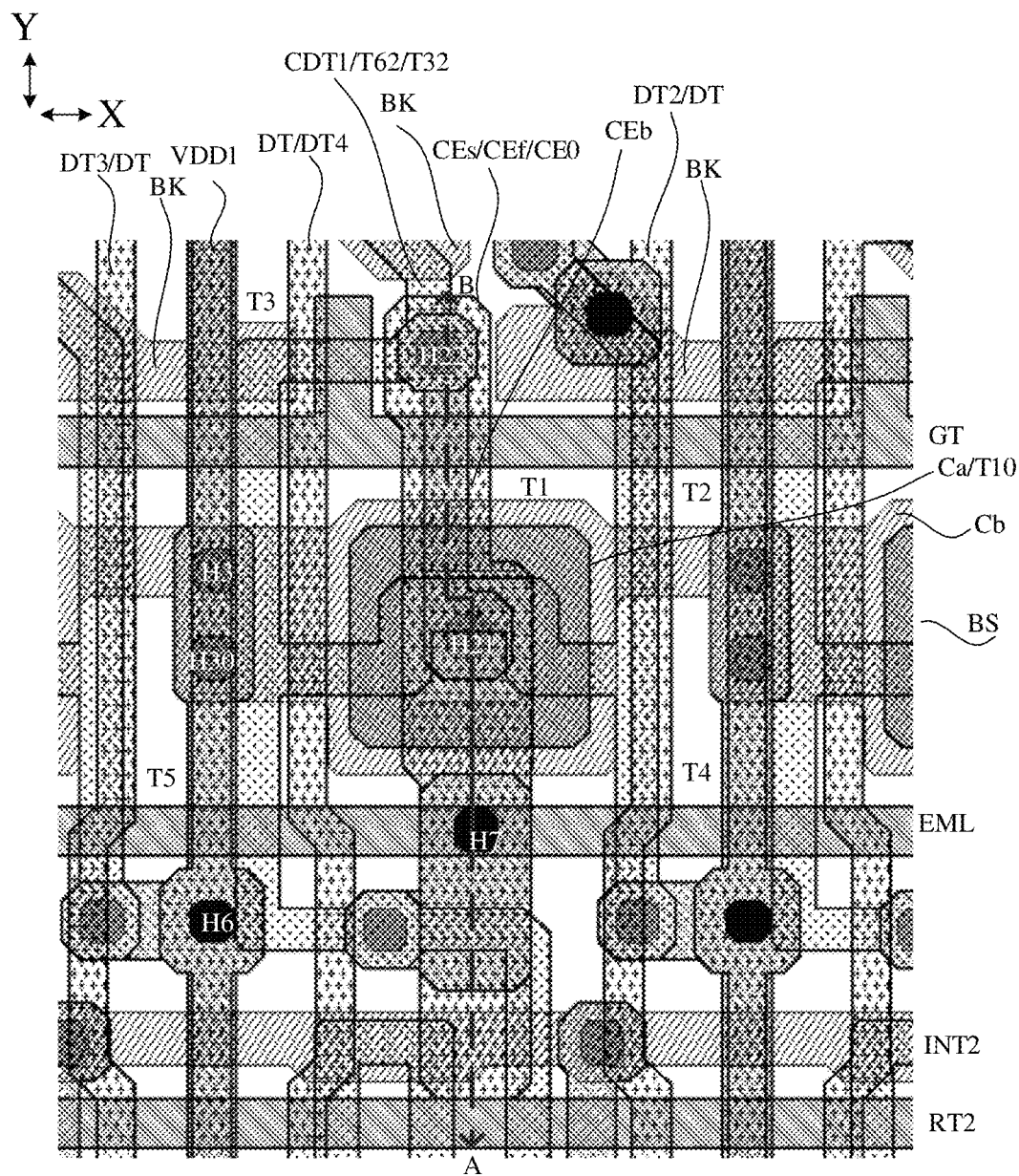
FIG. 17 is a schematic plan view of a display panel after forming a fourth conductive pattern layer according to another embodiment of the present disclosure.
Figure 18:
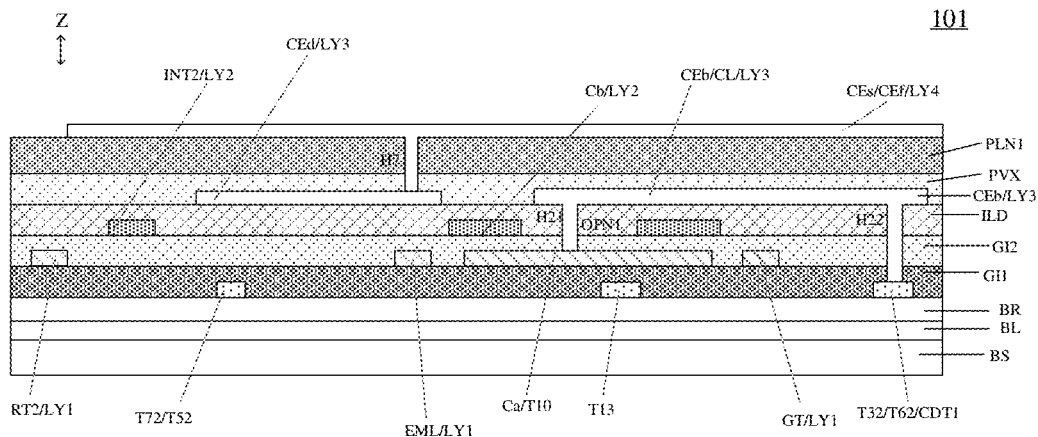
FIG. 18 is a partial sectional view of a display panel according to an embodiment of the present disclosure (a sectional view along line AB in FIG. 17)
Figure 19:
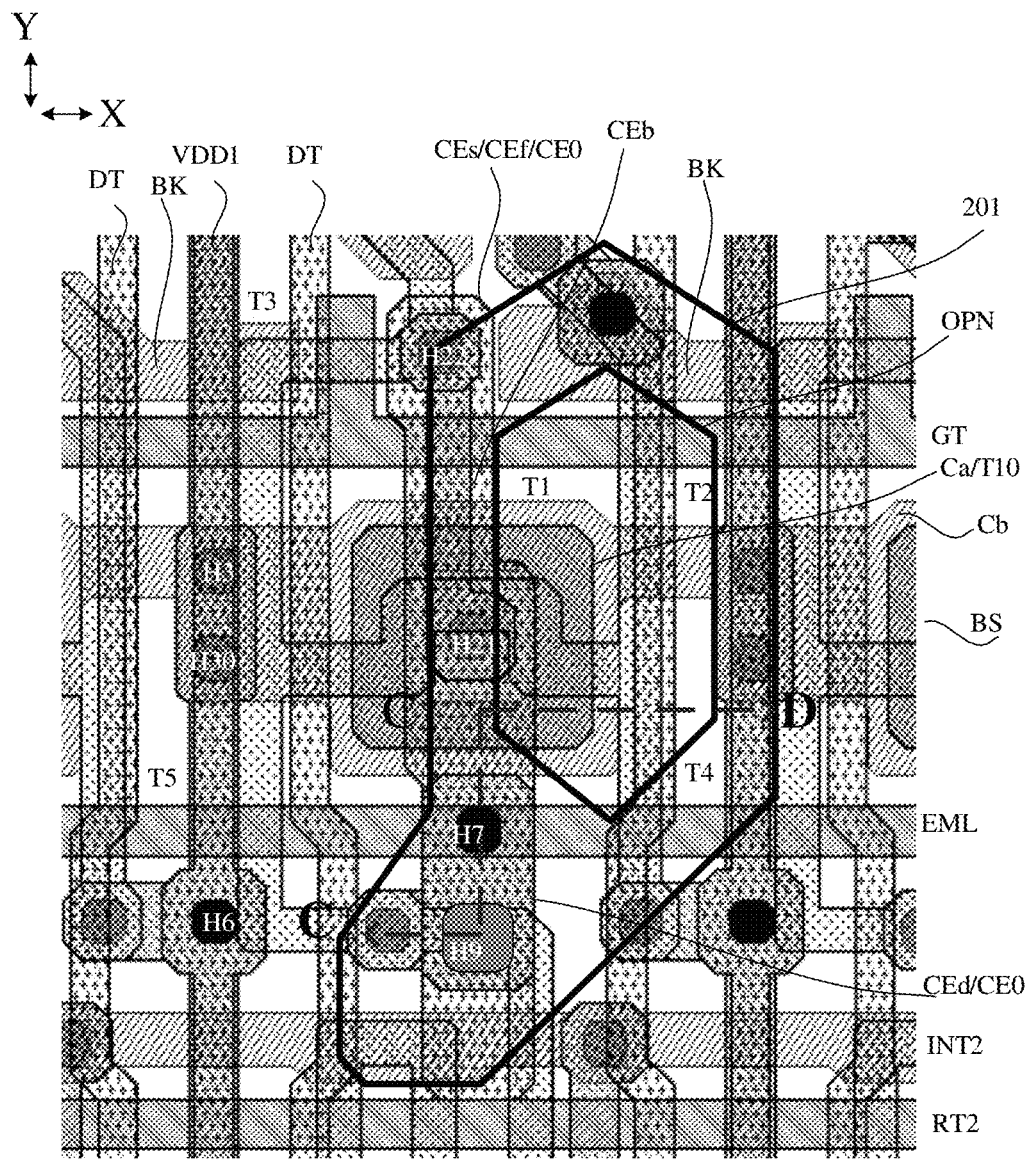
FIG. 19 is a partial plan view of a display panel according to an embodiment of the present disclosure.
Figure 20:
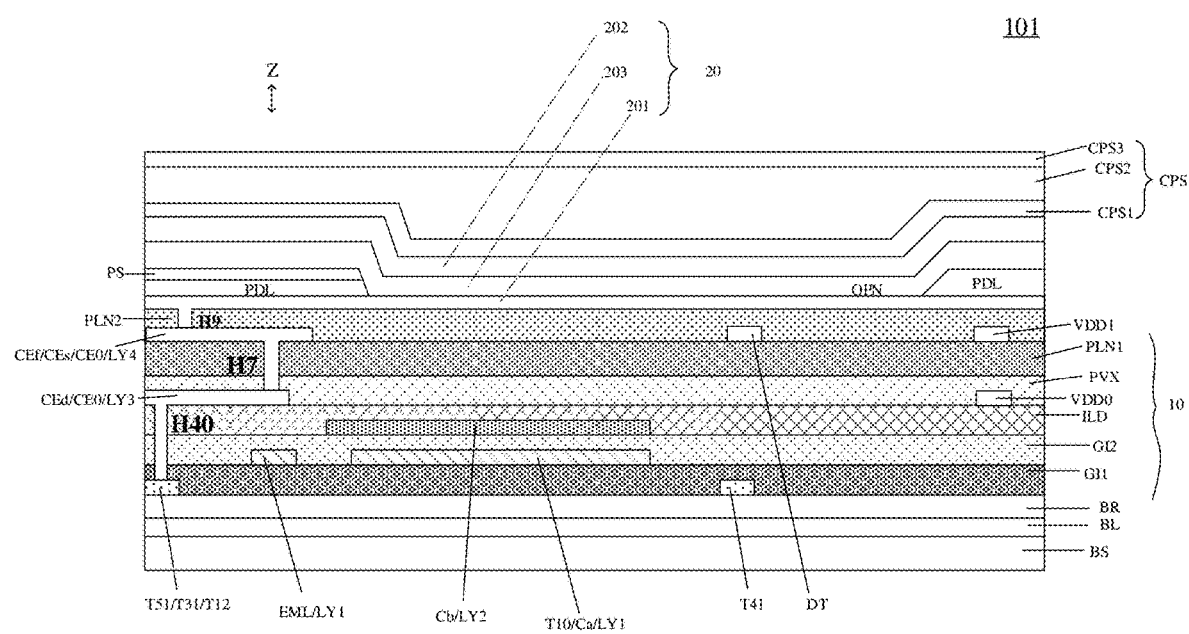
FIG. 20 is a partial sectional view of a display panel according to an embodiment of the present disclosure (a sectional view along the CD line in FIG. 19)
Figure 21:
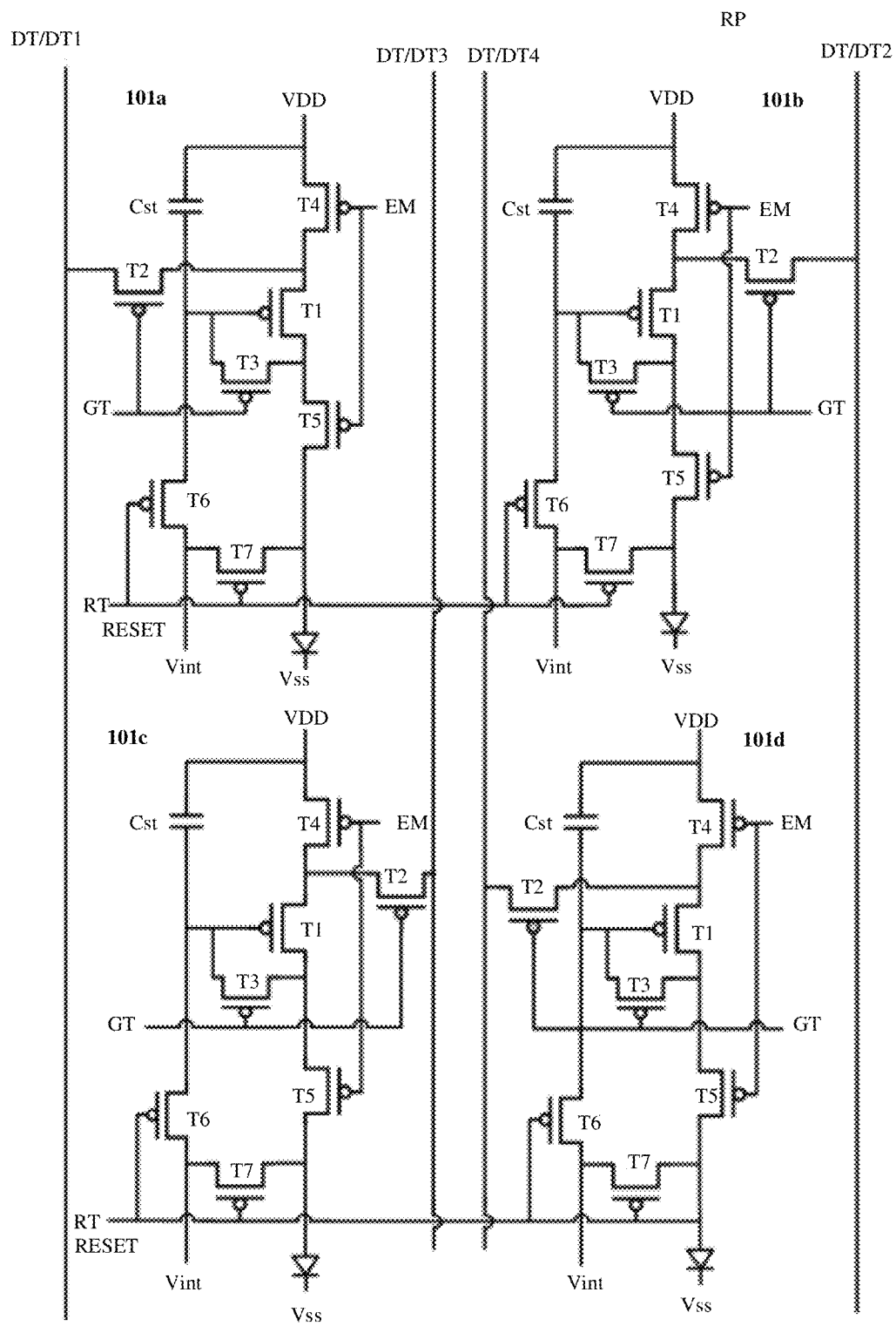
FIG. 21 is a pixel circuit diagram of a repeating unit of a display panel according to an embodiment of the present disclosure.

A display panel provided by an embodiment of the present disclosure will be described below with reference to FIGS. 3 to 21. FIG. 3 is a plan view of a semiconductor pattern in a display panel according to an embodiment of the present disclosure. FIG. 4 is a plan view of a first conductive pattern layer in a display panel according to an embodiment of the present disclosure. FIG. 5 is a schematic diagram of forming an active layer, a source electrode and a drain electrode of a thin film transistor in a display panel according to an embodiment of the present disclosure. FIG. 6 is a plan view of a second conductive pattern layer in a display panel according to an embodiment of the present disclosure. FIG. 7 is a schematic plan view of a display panel after forming a second conductive pattern layer according to an embodiment of the present disclosure. FIG. 8 is a schematic plan view of via holes formed in at least one of a first gate insulating layer, a second gate insulating layer and an interlayer insulating layer in a display panel according to an embodiment of the present disclosure. FIG. 9 is a schematic plan view of a display panel after via holes are formed in at least one of a first gate insulating layer, a second gate insulating layer and an interlayer insulating layer according to an embodiment of the present disclosure. FIG. 10 is a plan view of a third conductive pattern layer in a display panel according to an embodiment of the present disclosure. FIG. 11 is a plan view after forming a third conductive pattern layer in a display panel according to an embodiment of the present disclosure. FIG. 12 is a schematic plan view of via holes formed in a passivation layer and a first planarization layer in a display panel according to an embodiment of the present disclosure. FIG. 13 is a schematic plan view after via holes are formed in a passivation layer and a first planarization layer in a display panel according to an embodiment of the present disclosure. FIG. 14 is a plan view of a fourth conductive pattern layer in a display panel according to an embodiment of the present disclosure. FIG. 15 is a schematic plan view of a display panel after forming a fourth conductive pattern layer according to an embodiment of the present disclosure. FIG. 16A is a plan view of a fourth conductive pattern layer in a display panel according to another embodiment of the present disclosure. FIG. 17 is a schematic plan view of a display panel after forming a fourth conductive pattern layer according to another embodiment of the present disclosure. FIG. 18 is a partial sectional view of a display panel according to an embodiment of the present disclosure (the sectional view along line AB in FIG. 17). FIG. 19 is a partial plan view of a display panel according to an embodiment of the present disclosure. FIG. 20 is a partial sectional view of a display panel according to an embodiment of the present disclosure (the sectional view along the CD line in FIG. 19). FIG. 21 is a pixel circuit diagram of a repeating unit of a display panel according to an embodiment of the present disclosure.

FIGS. 5 to 17 and FIG. 19 show a first direction X and a second direction Y, and the second direction Y intersects with the first direction X. For example, the embodiment of the present disclosure takes the case where first direction X and the second direction Y are perpendicular as an example. For example, the first direction X is a row direction of pixel units, and the second direction Y is a column direction of pixel units. The first direction X and the second direction Y are both directions parallel to the base substrate BS. The first direction X is perpendicular to the second direction Y, for example. FIGS. 18 and 20 show a third direction Z, which is a direction perpendicular to the base substrate BS. A third direction Z is perpendicular to the first direction X and perpendicular to the second direction Y.

In the embodiment of the present disclosure, for the sake of clarity of illustration, the insulating layer is shown in the form of a via hole in a plan view, and the insulating layer itself is treated as being transparent, and the first conductive pattern layer, the second conductive pattern layer, the third conductive pattern layer and the fourth conductive pattern layer are treated as being semi-transparent.

FIG. 3 shows a semiconductor pattern SCP, and FIG. 4 shows a first conductive pattern layer LY1. For example, a first gate insulating layer (a first gate insulating layer GI1, refer to FIG. 18) is arranged between the first conductive pattern layer LY1 and the semiconductor pattern SCP. For example, a semiconductor pattern SCP and subsequent various components are formed on the base substrate. As illustrated by FIG. 4, the first conductive pattern layer LY1 includes a first reset control signal line RT1, a gate line GT, a first electrode Ca of the storage capacitor Cst (a gate electrode T10 of the driving transistor T1), a light-emitting control signal line EML, and a second reset control signal line RT2. The first conductive pattern layer LY1 is used as a mask to dope the semiconductor pattern SCP, so that the area covered by the first conductive pattern layer LY1 retains semiconductor characteristics and forms an active layer ACT (referring to FIG. 5), while the area not covered by the first conductive pattern layer LY1 of the semiconductor pattern SCP is conductive to form the source electrode and drain electrode of the thin film transistor. The active layer ACT formed after a part of the semiconductor pattern SCP has been made into being conductive is shown in FIG. 5. For example, in the embodiment of the present disclosure, the gate line GT of this stage is connected with the reset control signal line of the next stage. For example, the gate line GT and the second reset control signal line RT2 may be electrically connected and input with the same signal at the same time.

As illustrated by FIGS. 4 and 5, the first reset control signal line RT1, the gate line GT, the light-emitting control signal line EML and the second reset control signal line RT2 all extend along the first direction X.

For example, as illustrated by FIG. 5, in the manufacturing process of the display panel, the semiconductor pattern layer SCP is subjected to conductive treatment by using the first conductive pattern layer LY1 as a mask, for example, the semiconductor pattern layer SCP is heavily doped by ion implantation process, so that the part of the semiconductor pattern layer SCP not covered by the first conductive pattern layer LY1 is conductive, and a source region (first electrode T11) and a drain region (second electrode T12) of a driving transistor T1, a source region (first electrode T21) and a drain region (second electrode T22) of a data writing transistor T2, a source region (first electrode T31) and a drain region (second electrode T32) of a threshold compensation transistor T3, a source region (first electrode T41) and a source region (second electrode T42) of a first light-emitting control transistor T4, a source region (first electrode T51) and a drain region (second electrode T52) of a second light-emitting control transistor T5, a source region (first electrode T61) and a drain region (second electrode T62) of a first reset transistor T6, and a source region (first electrode T71) and a drain region (second electrode T72) of a second reset transistor T7 are formed. A part of the semiconductor pattern layer SCP covered by the first conductive pattern layer L1 retains semiconductor characteristics, so as to form a channel region T13 of the driving transistor T1, a channel region T23 of the data writing transistor T2, a channel region T33 of the threshold compensation transistor T3, a channel region T43 of the first light-emitting control transistor T4, a channel region T53 of the second light-emitting control transistor T5, a channel region T63 of the first reset transistor T6, and a channel region T73 of the second reset transistor T7. A channel region of each transistor constitutes an active layer ACT (refer to FIG. 5).

For example, as illustrated by FIG. 5, the second electrode T72 of the second reset transistor T7 and the second electrode T52 of the second light-emitting control transistor T5 are integrally formed; the first electrode T51 of the second light-emitting control transistor T5, the second electrode T12 of the driving transistor T1 and the first electrode T31 of the threshold compensation transistor T3 are integrally formed; the first electrode T11 of the driving transistor T1, the second electrode T22 of the data writing transistor T2 and the second electrode T42 of the first light-emitting control transistor T4 are integrally formed. The second electrode T32 of the threshold compensation transistor T3 and the second electrode T62 of the first reset transistor T6 are integrally formed.

For example, the channel region (active layer) of the transistor adopted in the embodiments of the present disclosure can be monocrystalline silicon, polycrystalline silicon (such as low-temperature polycrystalline silicon) or metal oxide semiconductor materials (such as IGZO, AZO, etc.). In an embodiment, the transistors are all P-type low temperature polysilicon (LTPS) thin film transistors. In another embodiment, the threshold compensation transistor T3 and the first reset transistor T6 directly connected with the gate electrode of the driving transistor T1 are metal oxide semiconductor thin film transistors, that is, the channel materials of the transistors are metal oxide semiconductor materials (such as IGZO, AZO, etc.), and the metal oxide semiconductor thin film transistors have lower leakage current, which can help to reduce the gate leakage current of the driving transistor T1.

For example, the transistors adopted in the embodiments of the present disclosure may include various structures, such as top gate type, bottom gate type or double gate structure. In some embodiments, the threshold compensation transistor T3 and the first reset transistor T6, which are directly connected with the gate electrode of the driving transistor T1, are dual-gate thin film transistors, which can help to reduce the gate leakage current of the driving transistor T1.

For example, as illustrated by FIG. 5, a part of the light-emitting control signal line EML serves as the gate electrode T40 of the first light-emitting control transistor T4, a part of the light-emitting control signal line EML serves as the gate electrode T50 of the second light-emitting control transistor T5, the gate electrode T60 of the first reset transistor T6 is a part of the first reset control signal line RT1, the gate electrode T70 of the second reset transistor T7 is a part of the second reset control signal line RT2, the gate electrode T20 of the data writing transistor T2 is a part of the gate line GT, and the gate electrode T30 of the threshold compensation transistor T3 is a part of the gate line GT.

As illustrated by FIG. 5, the threshold compensation transistor T3 is a double-gate transistor, and includes a first channel T331 and a second channel T332, the first channel T331 and the second channel T332 are connected by a first conductive connection portion CP1. As illustrated by FIG. 5, the first reset transistor T6 is a double-gate transistor, and includes a first channel T631 and a second channel T632, the first channel T631 and the second channel T632 are connected by a second conductive connection portion CP2.

FIG. 6 shows the second conductive pattern layer LY2. For example, a second gate insulating layer (a second gate insulating layer GI2, refer to FIG. 18) is provided between the second conductive pattern layer LY2 and the first conductive pattern layer LY1. The second conductive pattern layer LY2 includes a blocker BK, a first initialization signal line INT1, a second initialization signal line INT2, and a second electrode Cb of the storage capacitor Cst. For example, referring to FIG. 6, the first initialization signal line INT1 extends along the first direction X, and the second initialization signal line INT2 extends along the first direction X. The first initialization signal line INT1 and the second initialization signal line INT2 are arranged along the second direction Y. As illustrated by FIG. 6, the first initialization signal line INT1 and the second initialization signal line INT2 are located on both sides of the second electrode Cb of the storage capacitor Cst, the first initialization signal line INT1 and the second initialization signal line INT2 are located on both sides of the blocker BK, and the blocker BK and the second electrode Cb of the storage capacitor Cst are arranged between the first initialization signal line INT1 and the second initialization signal line INT2. As illustrated by FIG. 6, the first initialization signal line INT1, the blocker BK, the second electrode Cb of the storage capacitor Cst, and the second initialization signal line INT2 are sequentially arranged along the second direction Y. The blocker BK is electrically connected with the first power line VDD1, so that the first power line VDD1 provides a constant voltage for the blocker BK.

As illustrated by FIG. 7, an orthographic projection of the blocker BK on the base substrate at least partially overlaps with an orthographic projection of the first conductive connection CP1 on the base substrate. That is, the blocker BK is configured to shield the first conductive connection CP1 between the two channels of the threshold compensation transistor T3, and the blocker BK and the first conductive connection CP1 form a capacitor (stabilization capacitor) to avoid the threshold compensation transistor T3 from generating leakage current and affecting the display effect. As illustrated by FIG. 7, the blocker BK and the first conductive connection CP1 are partially overlapped in the plan view.

As illustrated by FIG. 7, in the plan view, the first initialization signal line INT1 and the second conductive connection portion CP2 are partially overlapped, and a capacitor (stabilization capacitor) is formed between the first initialization signal line INT1 and the second conductive connection portion CP2, so as to avoid the leakage current generated by the first reset transistor T6 and to avoid affecting the display effect.

For example, in the embodiment of the present disclosure, element A and element B are partially overlapped, which may refer to that a part of element A overlaps with element B, a part of element B overlaps with element A, or a part of element A overlaps with a part of element B. Element A and element B are two different elements.

As illustrated by FIG. 7, the gate line GT extends along the first direction X, the first reset control signal line RT1 extends along the first direction X, and the blocker BK is located between the gate line GT and the first reset control signal line RT1. Thereby, the position of the blocker BK in the second direction Y is defined.

As illustrated by FIG. 6 and FIG. 7, the blocker BK includes a first portion BKa extending along the first direction X, a second portion BKb extending along the second direction Y, and a third portion BKc extending along the first direction X, the first portion BKa and the third portion BKc are connected by the second portion BKb, and the first portion BKa and the second portion BKb form an inverted T-shaped structure. For example, the third portion BKc has a T-shaped structure. For example, as illustrated by FIG. 6, the first portion BKa, the second portion BKb and the third portion BKc are located on the same layer and have an integrated structure. The function of each part of the blocker in the shape shown in FIGS. 6 and 7 will be described later.

As illustrated by FIG. 5, FIG. 7 and FIG. 15, the display panel includes a first conductive structure CDT1, which is connected with the gate electrode T10 of the driving transistor T1. An orthographic projection of the first conductive structure CDT1 on the base substrate at least partially overlaps with the orthographic projection of the blocker BK on the base substrate, so that the blocker BK shields the parasitic capacitance between the gate signal portion PT1 of the driving transistor (including the gate electrode T10 of the driving transistor T1 and the first conductive structure CDT1) and the data line, thereby reducing the coupling effect and alleviating the longitudinal crosstalk. With reference to FIGS. 15 and 6, the orthographic projection of the first conductive structure CDT1 on the base substrate at least partially overlaps with the orthographic projection of the third portion BKc of the blocker BK on the base substrate.

For example, the material of the first conductive structure CDT1 is the same as that of the first conductive connection CP1. For example, the first conductive structure CDT1 and the first conductive connecting portion CP1 can be made of the same film layer by the same process.

For example, the material of the first conductive structure CDT1 includes a conductive material obtained by doping a semiconductor material. For example, the material of the first conductive structure CDT1 includes a conductive material obtained by doping polysilicon, but the embodiments of the present disclosure are not limited thereto.

For example, as illustrated by FIG. 5, FIG. 7 and FIG. 15, the first conductive structure CDT1 is multiplexed as the second electrode T62 of the first reset transistor T6, and the orthographic projection of the second electrode T62 of the first reset transistor T6 on the base substrate at least partially overlaps with the orthographic projection of the blocker BK on the base substrate. In the embodiment of the present disclosure, the first conductive structure CDT1 is taken as the second electrode T62 of the first reset transistor T6 as an example.

For example, as illustrated by FIGS. 5, 7 and 15, the first electrode T61 of the first reset transistor T6 partially overlaps with the blocker BK in plan view, that is, the orthographic projection of the first electrode T61 of the first reset transistor T6 on the base substrate at least partially overlaps with the orthographic projection of the blocker BK on the base substrate. This arrangement can increase the area of the blocker and make it play a better role in shielding.

Figure 16B:
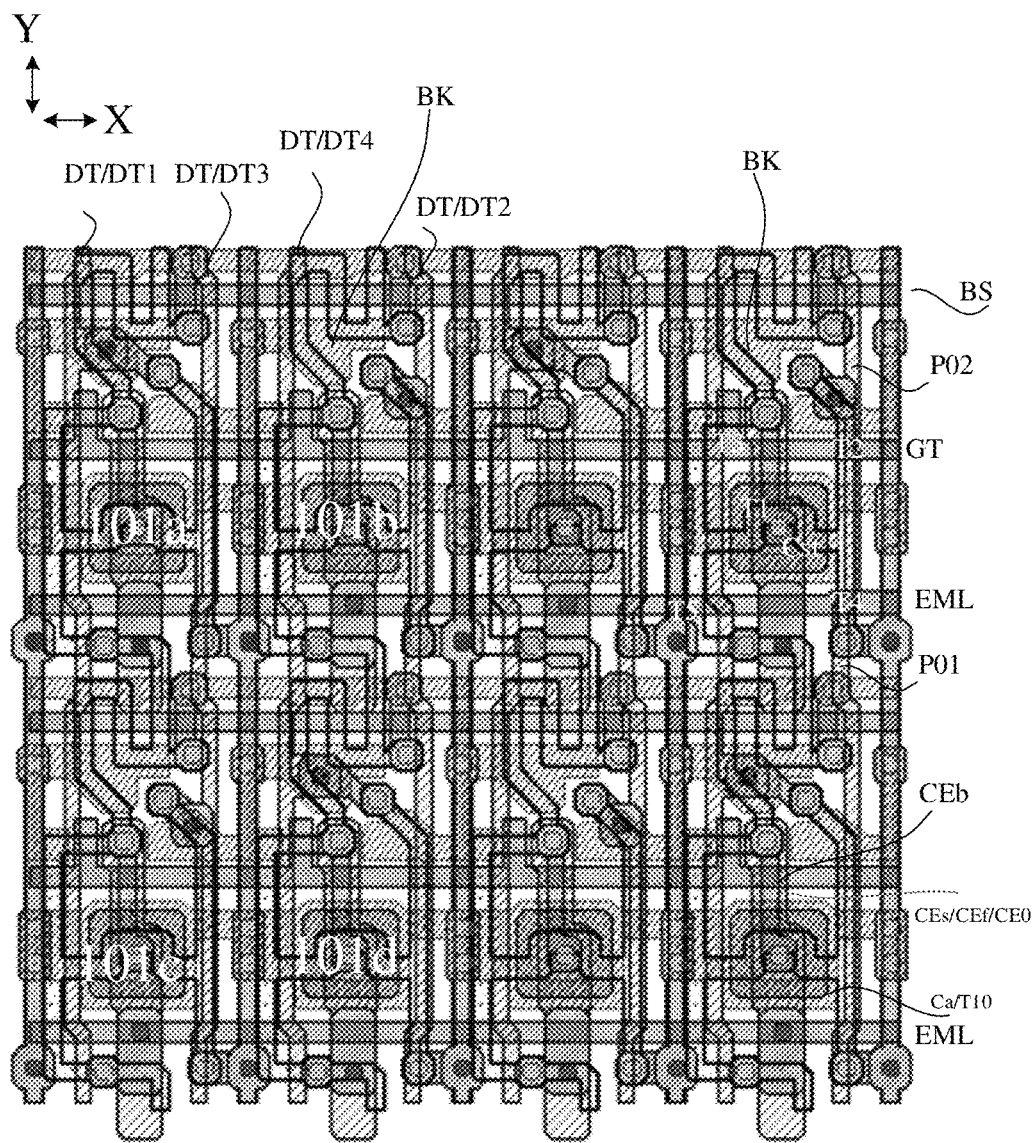
FIG. 16B is a plan view of a fourth conductive pattern layer in a display panel according to another embodiment of the present disclosure.

For example, referring to FIG. 16A and FIG. 16B, the data line DT includes a first portion P01 and a second portion P02, a distance SP1 between first portions P01 of two adjacent data lines DT is larger than a distance SP2 between second portions P02 of two adjacent data lines DT, the shielding portion CEs is located between the second portions P02 of two adjacent data lines DT. As illustrated by FIG. 16A and FIG. 16B, the shielding portion CEs is located between the first portions P01 of two adjacent data lines DT.

For example, as illustrated by FIG. 16B, the second portions P02 of two adjacent data lines DT are respectively close to the first light-emitting control transistor T4 and the second light-emitting control transistor T5, the storage capacitor Cst is located between the first portions P01 of two adjacent data lines DT.

The second portions P02 of two adjacent data lines DT may also be called a narrowing portion, as illustrated by FIG. 16B, two adjacent data lines DT are narrowed at the position where the first light-emitting control transistor T4 and the second light-emitting control transistor T5 are located, and are not narrowed at the position where the storage capacitor Cst is located.

With reference to FIG. 17, in order to better play a shielding role, the orthographic projection of a shielding portion CEs on the base substrate at least partially overlaps with the orthographic projection of the first conductive structure CDT1 on the base substrate.

Referring to FIGS. 5 and 17, the orthographic projection of the shielding portion CEs on the base substrate partially overlaps with the orthographic projection of the second conductive connection portion CP2 of the first reset transistor T6 on the base substrate. With reference to FIGS. 5, 14, 15 and 17, for example, the orthographic projection of the shielding portion CEs in the first pixel unit 101a on the base substrate partially overlaps with the orthographic projection of the second conductive connection CP2 of the first reset transistor T6 in the third pixel unit 101c on the base substrate. That is, the orthographic projection of the shielding portion CEs in one pixel unit 101 on the base substrate overlaps with the orthographic projection of the second conductive connection CP2 of the first reset transistor T6 in the next pixel unit located in the same column as the pixel unit.

With reference to FIGS. 14 to 16A, taking the blocker BK in the upper left corner of FIG. 15 as an example, the blocker BK overlaps with the first conductive connection CP1 of the threshold compensation transistor T3 of the second pixel unit 101b to form a stabilization capacitor to reduce leakage current.

As illustrated by FIG. 7, the area A1 of an orthographic projection of a portion of the blocker BK overlapping the first conductive structure CDT1 (the second electrode T62 of the first reset transistor T6) on the base substrate is larger than the area A0 of an orthographic projection of a portion of the blocker BK overlapping the first conductive connection CP1 on the base substrate. That is, the area A1 of the orthographic projection of an overlapping portion of the blocker BK and the first conductive structure CDT1 on the base substrate is larger than the area A0 of the orthographic projection of an overlapping portion of the blocker BK and the first conductive connection portion CP1 on the base substrate.

As illustrated by FIG. 10, the third conductive pattern layer LY3 includes a power supply connection line VDD0, a connection electrode CEa, a connection electrode CEb, a connection electrode CEc, a connection electrode CEd (a second connection electrode CEd) and a connection electrode CEe (a first connection electrode CEe). An interlayer insulating layer (interlayer insulating layer ILD, refer to FIG. 18) is provided between the third conductive pattern layer LY3 and the second conductive pattern layer LY2.

With reference to FIGS. 9 to 11, the power supply connection line VDD0 is electrically connected with the first electrode T41 of the first light-emitting control transistor T4 through a via hole H2, the power supply connection line VDD0 is electrically connected with the second electrode Cb of the storage capacitor Cst through via holes H3 and H30, and the power supply connection line VDD0 is electrically connected with the conductive block BK through a via hole H0. One end of the connection electrode CEa is electrically connected with the first initialization signal line INT1 through a via hole H12, and the other end of the connection electrode CEa is electrically connected with the first electrode T61 of the first reset transistor T6 through a via hole H11, so that the first electrode T61 of the first reset transistor T6 is electrically connected with the first initialization signal line INT1. One end of the connection electrode CEb is electrically connected with the second electrode T62 of the first reset transistor T6 through a via hole H22, and the other end of the connection electrode CEb is electrically connected with the gate electrode T10 of the driving transistor T1 (i.e., the first electrode Ca of the storage capacitor Cst) through a via hole H21, so that the second electrode T62 of the first reset transistor T6 is electrically connected with the gate electrode T10 of the driving transistor T1 (i.e., the first electrode Ca of the storage capacitor Cst). One end of the connection electrode CEc is electrically connected with the second initialization signal line INT2 through a via hole H32, and the other end of the connection electrode CEc is electrically connected with the first electrode T71 of the second reset transistor T7 through a via hole H31, so that the first electrode T71 of the second reset transistor T7 is electrically connected with the second initialization signal line INT2. A connection electrode CEd is electrically connected with a second electrode T52 of the second light-emitting control transistor T5 through a via hole H40. The connection electrode CEd can be used to be connected with the connection electrode CEf formed later, and then electrically connected with the first electrode 201 (refer to FIG. 17) of the light-emitting element 20. A connection electrode CEe is electrically connected with a first electrode T21 of the data writing transistor T2 through a via hole H5. A connection electrode CEe is used to be connected with the data line.

FIG. 14 shows a fourth conductive pattern layer LY4. The fourth conductive pattern layer LY4 includes a data line DT, a connection electrode CEf, and a first power line VDD1. A passivation layer (passivation layer PVX, refer to FIG. 18) and a first planarization layer (first planarization layer PLN1, refer to FIG. 18) are provided between the third conductive pattern layer LY3 and the fourth conductive pattern layer LY4. The first power line VDD1 is connected with the power supply connection line VDD0 through a via hole H6 penetrating through the passivation layer and the first planarization layer, and the connection electrode CEf is connected with the connection electrode CEd through a via hole H7 penetrating through the passivation layer and the first planarization layer. A data line DT is connected with the connection electrode CEe through a via hole H8 penetrating through the passivation layer and the first planarization layer, and then electrically connected with the first electrode T21 of the data writing transistor T2. For example, the connection electrode CEf (third connection electrode CEf) and the connection electrode CEd (second connection electrode CEd) constitute the connection element CE0. For example, the light-emitting element 20 is connected with the pixel circuit 10 through the connection element CE0. For example, the pixel circuit 10 is connected with a connection electrode CEd (second connection electrode CEd) which is connected with a connection electrode CEf (third connection electrode CEf) which is connected with the light-emitting element 20.

FIG. 14 shows a first data line DT1, a second data line DT2, a third data line DT3 and a fourth data line DT4. FIG. 14 also shows positions of a first pixel unit 101a, a second pixel unit 101b, a third pixel unit 101c and a fourth pixel unit 101d.

As illustrated by FIGS. 14, 16A and 16B, the data line DT extends along the second direction Y, and the first data line DT1, the third data line DT3, the fourth data line DT4 and the second data line DT2 are arranged along the first direction X. The fourth data line DT4 is located between the third data line DT3 and the second data line DT2. The first pixel unit 101a and the second pixel unit 101b are located in the same row and adjacent columns, and the third pixel unit 101c and the fourth pixel unit 101d are located in the same row and adjacent columns. The first pixel unit 101a and the third pixel unit 101c are located in the same column and adjacent rows, and the second pixel unit 101b and the fourth pixel unit 101d are located in the same column and adjacent rows. As illustrated by FIG. 15, the data line DT and the gate line GT cross each other and are insulated from each other.

For example, the first power line VDD1 is configured to supply the first voltage signal ELVDD to the pixel circuit 10. The first power line VDD1 is electrically connected with the blocker BK to provide a constant voltage to the blocker BK. The first power line VDD1 is connected with the first power supply terminal VDD, and the second electrode Cb of the storage capacitor Cst is connected with the first power line VDD1. For example, the second electrode Cb of the storage capacitor Cst is connected with the first power supply terminal VDD through the power supply connection line VDD0 and the first power line VDD1. FIG. 15 shows a plan view of the structure after forming the fourth conductive pattern layer LY4.

For example, the first electrode T41 of the first light-emitting control transistor T4 is connected with the first power supply terminal VDD through a power supply connection line VDD0 and a first power line VDD1 (refer to FIGS. 10 and 15).

As illustrated by FIG. 5, FIG. 7 and FIG. 15, the display panel includes a second conductive structure CDT2, and the orthographic projection of the blocker BK on the base substrate at least partially overlaps with the orthographic projection of the second conductive structure CDT2 on the base substrate, so as to shield the interference between the first data signal on the first data line DT1 and the third data signal on the third data line DT3 and avoid abnormal display caused by coupling. In the first pixel unit 101a and the second pixel unit 101b, for example, the blocker BK overlaps with the first conductive connection CP1 of the threshold compensation transistor T3 of the second pixel unit 101b and overlaps with the second conductive structure CDT2 of the first pixel unit 101a. For example, the material of the second conductive structure CDT2 is the same as that of the first conductive structure CDT1.

As illustrated by FIGS. 5, 7 and 15, the first electrode T21 of the data writing transistor T2 is multiplexed into the second conductive structure CDT2. In the embodiment of the present disclosure, the first electrode T21 of the data writing transistor T2 is used as the second conductive structure CDT2 as an example, but it is not limited thereto.

As illustrated by FIG. 15, the data line DT, the connection electrode CEe, and the second conductive structure CDT2 constitute a data signal portion PT2. For example, the data line DT, the connection electrode CEe, and the second conductive structure CDT2 constitute the same node. For example, the potentials on the data line DT, the connection electrode CEe, and the second conductive structure CDT2 are the same or substantially the same. That is, the potential at each position on the data signal portion PT2 is the same or substantially the same. Therefore, the blocker BK overlaps with the second conductive structure CDT2, which can shield the interference between the first data signal on the first data line DT1 and the third data signal on the third data line DT3, and avoid abnormal display caused by coupling.

With reference to FIG. 7, the area A2 of an orthographic projection of a portion of the blocker BK overlapping with the second conductive structure CDT2 (the first electrode T21 of the data writing transistor T2) on the base substrate is larger than the area A0 of an orthographic projection of a portion of the blocker BK overlapping with the first conductive connection CP1 on the base substrate. For example, the data line DT is connected with the connection electrode CEe through a via hole H8, and then connected with the second conductive structure CDT2.

With reference to FIG. 7, the area A1 of the orthographic projection of the portion of the blocker BK overlapping with the first conductive structure CDT1 on the base substrate is larger than the area A2 of the orthographic projection of the portion of the blocker BK overlapping with the second conductive structure CDT2 on the base substrate. For example, the area A1 is larger than the area A2, and the area A2 is larger than the area A0. That is, the area A1, the area A2, and the area A0 decrease in sequence, but the embodiments of the present disclosure are not limited thereto.

With reference to FIGS. 13 to 15, according to the manufacturing sequence of each layer of the display panel, it can be known that the blocker BK is located between the second conductive structure CDT2 (the first electrode T21 of the data writing transistor T2) and the third data line DT3 in the direction perpendicular to the base substrate.

As illustrated by FIG. 15, the orthographic projection of the blocker BK on the base substrate overlaps with the orthographic projection of the third data line DT3 on the base substrate, so that the blocker BK shields the interference between the first data signal on the first data line DT1 and the third data signal on the third data line DT3, and avoids display abnormality caused by coupling. Referring to FIG. 15 and FIG. 6, the orthographic projection of the first portion BKa of the blocker BK on the base substrate overlaps with the orthographic projection of the third data line DT3 on the base substrate, so that the first portion BKa of the blocker BK shields the interference between the first data signal on the first data line DT1 and the third data signal on the third data line DT3, and avoids abnormal display caused by coupling.

As illustrated by FIG. 15, in the plan view, one blocker BK corresponds to two pixel units in the same row. As illustrated by FIG. 15, the blocker BK is located between the first data line DT1 and the second data line DT2 in the plan view.

As illustrated by FIG. 5, FIG. 7 and FIG. 15, the orthographic projection of the first electrode T21 of the data writing transistor T2 on the base substrate at least partially overlaps with the orthographic projection of the third data line DT3 on the base substrate.

With reference to FIGS. 14 to 16B, the blocker BK extends leftward into the first pixel unit 101a adjacent to the second pixel unit 101b, so that the blocker BK has a portion between the first data line DT1 and the third data line DT3, so as to shield interference between the first data signal on the first data line DT1 and the third data signal on the third data line DT3 and avoid display abnormality caused by coupling. The first data line DT1 and the third data line DT3 are two adjacent data lines.

For example, in the embodiment of the present disclosure, two adjacent elements C refer to that the two elements C are adjacent to each other, and no element C is arranged between them, but it is not excluded that other elements besides the element C are arranged between the two adjacent elements C.

For example, the 120 Hz driving scheme adopts the time-sharing writing method, that is, the data signal is first stored in the storage capacitor, and then the scanning signal is turned on and then written into the pixel unit, and the interference between the data signals will affect the accurate writing of the data signal and the display effect; the design that the blocker BK extends leftward and plays a shielding role can improve this problem well.

In the conventional technology, the gate electrode T10 of the driving transistor T1 is in a floating state in the light-emitting phase and is held by the storage capacitor Cst. Due to the parasitic capacitance between the gate electrode and the data line, the data signal jump will be coupled to the gate signal portion (the first node N1) of the driving transistor and cannot be restored to the initial state, resulting in longitudinal crosstalk.

Referring to FIG. 14 to FIG. 16B, the blocker BK extends rightward and overlaps with the first conductive structure CDT1 (the second electrode T62 of the first reset transistor T6) of the first pixel unit 101a, thereby covering the signal on the gate electrode T10 of the driving transistor T1 of the first pixel unit 101a, shielding the parasitic capacitance between the gate electrode T10 of the driving transistor T1 (the gate signal portion PT1 of the driving transistor) and the data line, reducing the coupling effect and alleviating the longitudinal crosstalk.

In another embodiment, the length of the connection electrode CEf in the display panel in the second direction Y is adjusted, and as illustrated by FIG. 16A and FIG. 16B, the length of the connection electrode CEf in the second direction Y is increased. A connection electrode CEf shown in FIG. 16A and FIG. 16B may be called a shielding portion CEs. The shielding portion CEs and the connection electrode CEd (second connection electrode CEd) constitute a connection element CE0. The shielding portion CEs can replace the connection electrode CEf, and no extra process is needed.

Referring to FIGS. 10 and 11, the other end of the connection electrode CEb is electrically connected with the gate electrode T10 of the driving transistor T1 (i.e., the first electrode Ca of the storage capacitor Cst) through a via hole H21, and one end of the connection electrode CEb is electrically connected with the second electrode T62 of the first reset transistor T6 through a via hole H22, the connection electrode CEb can also be called a connection line CL. As illustrated by FIG. 11, the gate electrode T10 of the driving transistor T1 is connected with the second electrode T32 of the threshold compensation transistor T3 through a connection line CL.

For example, referring to FIGS. 10 and 11, the first conductive structure CDT1 is connected with the gate electrode T10 of the driving transistor T1 through a connection line CL. In other words, the gate electrode T10 of the driving transistor T1 is connected with the first conductive structure CDT1 through the connection line CL. For example, the material of the first conductive structure CDT1 is different from that of the connection line CL. The material of the connection line CL includes metal, for example.

For example, as illustrated by FIGS. 11 and 18, the connection line CL is in contact with the gate electrode T10 of the driving transistor T1. For example, as illustrated by FIGS. 11 and 18, the connection line CL is in contact with the first conductive structure CDT1. That is, two ends of the connection line CL are in contact with the gate electrode T10 of the driving transistor T1 and the first conductive structure CDT1, respectively.

For example, as illustrated by FIG. 11, the first conductive structure CDT1, the connection line CL, and the gate electrode T10 of the driving transistor T1 constitute a gate signal portion PT1 of the driving transistor T1. Therefore, the overlap between the blocker BK and the first conductive structure CDT1 can shield the parasitic capacitance between the gate signal portion of the driving transistor and the data line, and reduce the longitudinal crosstalk. For example, the first conductive structure CDT1, the connection line CL, and the gate electrode T10 of the driving transistor T1 constitute the same node. For example, the potentials on the first conductive structure CDT1, the connection line CL and the gate electrode T10 of the driving transistor T1 are the same or substantially the same. That is, the potential at each position on the gate signal portion PT1 is the same or substantially the same.

Referring to FIG. 16A, FIGS. 16B and 17, the shielding portion CEs extends in the second direction Y. For example, the extending direction of the shield portion CEs is the same as the extending direction of the data line DT. As illustrated by FIG. 20, the light-emitting element 20 is connected with the pixel circuit 10 through a connection element CE0. In the embodiment of the present disclosure, the extension mode of a component refers to the general extending direction or trend of the component, and not all positions of the component extend along the extension direction.

Referring to FIG. 16A, FIGS. 16B and 17, the data line DT and the shielding portion CEs are located on the same layer, and both the data line DT and the shield portion CEs are located on the fourth conductive pattern layer LY4. The data line DT includes two adjacent data lines DT, and the shielding portion CEs is located between the two adjacent data lines DT, and the orthographic projection of the shielding portion CEs on the base substrate BS at least partially overlaps with the orthographic projection of the connection line CL on the base substrate BS. For example, two adjacent data lines DT are arranged along a first direction X, and the data lines DT extend along a second direction. Referring to FIG. 16A, FIGS. 16B and 17, the data line DT includes a first data line DT1 and a third data line DT3, which are adjacent to each other, and the shielding portion CEs is located between the first data line DT1 and the third data line DT3 in the first direction X. In an embodiment of the present disclosure, adjacent elements A and B refers to that there is neither element A nor element B between the elements A and B. The shielding portion CEs extends along the second direction and is located between two adjacent data lines DT, and the shielding effect is more obvious at the position where the distance between adjacent data lines is closer. The embodiment of the present disclosure takes the case where the data line DT and the shielding portion CEs are located in the same layer as an example, and in other embodiments, the data line DT and the shielding portion CEs are located in the same layer or different layers.

In the embodiment of the present disclosure, the orthographic projection of the shielding portion CEs on the base substrate BS at least partially overlaps with the orthographic projection of the connection line CL on the base substrate BS, so that the shielding portion CEs shields the parasitic capacitance between the gate signal portion of the driving transistor and the data line, and reduces the longitudinal crosstalk problem.

For example, the 120 Hz driving scheme adopts the time-sharing writing method, that is, the data signal is stored in the storage capacitor first, and then the scanning signal is turned on and then written into the pixel unit. The interference between the data signals will affect the accurate writing of the data signal and the display effect. In the embodiment of the present disclosure, the shielding portion CEs is located between two adjacent data lines DT, and the orthographic projection of the connection line CL on the base substrate BS at least partially overlaps with the orthographic projection of the shielding portion CEs on the base substrate BS, which can well reduce the coupling effect and improve this problem. It should be noted that the shielding portion CEs is located between two adjacent data lines DT, which is the setting position of the described shielding portion CEs. The shielding portion CEs is located between two adjacent data lines DT, but there may not be a shielding portion CEs between every two adjacent data lines DT. As illustrated by FIG. 16A and FIG. 17, the first data line DT1 and the third data line DT3 are adjacent to each other, and the shielding portion CEs is located between the first data line DT1 and the third data line DT3; while the fourth data line DT4 and the second data line DT2 are adjacent to each other, and the shielding portion CEs is located between the fourth data line DT4 and the second data line DT2. Although the third data line DT3 and the fourth data line DT4 are adjacent to each other, no shielding portion CEs is located therebetween.

For example, as illustrated by FIG. 17, in order to minimize the longitudinal crosstalk to a great extent, the orthographic projection of the shielding portion CEs on the base substrate BS is larger than that of the connection line CL on the base substrate BS. For example, the orthographic projection of the shielding portion CEs on the base substrate BS covers the orthographic projection of the connection line CL on the base substrate BS. For example, in the plan view, the shielding portion CEs covers the connection line CL. As illustrated by FIGS. 17 and 18, the main surface of the base substrate BS is a surface for manufacturing each component, and each component is provided on the main surface of the base substrate BS.

For example, in order to reduce the longitudinal crosstalk to a great extent, the orthographic projection of the gate electrode T10 of the driving transistor T1 on the base substrate BS partially overlaps with the orthographic projection of the shielding portion CEs on the base substrate BS, and the overlapping area of the shielding portion CEs and the gate electrode T10 of the driving transistor T1 is smaller than that of the gate electrode T10 of the driving transistor T1.

For example, as illustrated by FIG. 17, the size of the gate electrode T10 of the driving transistor T1 in the first direction X is larger than that of the shielding portion CEs in the first direction X; the size of the shielding portion CEs in the second direction Y is larger than the size of the gate electrode of the driving transistor T1 in the second direction Y.

For example, as illustrated by FIG. 17, the gate electrode T10 of the driving transistor T1 respectively exceeds the shielding portion CEs from both sides in the first direction X.

For example, as illustrated by FIG. 17, the orthographic projection of the shielding portion CEs on the base substrate BS overlaps with the orthographic projection of the gate line GT on the base substrate BS.

For example, as illustrated by FIG. 17, the orthographic projection of the gate line GT on the base substrate BS partially overlaps with the orthographic projection of the shield portion CEs on the base substrate BS.

For example, the pixel unit includes two adjacent pixel units located in the same column, and two adjacent data lines DT are respectively connected with the two pixel units. FIG. 16A shows the positions of the first pixel unit 101a, the second pixel unit 101b, the third pixel unit 101c and the fourth pixel unit 101d. FIG. 16A shows a first data line DT1, a second data line DT2, a third data line DT3 and a fourth data line DT4. With reference to FIGS. 16A and 17, the first data line DT1 is connected with the first pixel unit 101a, the second data line DT2 is connected with the second pixel unit 101b, the third data line DT3 is connected with the third pixel unit 101c, and the fourth data line DT4 is connected with the fourth pixel unit 101d. The first data line DT1 is configured to provide a first data signal to the pixel circuit of the first pixel unit 101a. The second data line DT2 is configured to provide a second data signal to the pixel circuit of the second pixel unit 101b. The third data line DT3 is configured to provide a third data signal to the pixel circuit of the third pixel unit 101c. The fourth data line DT4 is configured to provide a fourth data signal to the pixel circuit of the fourth pixel unit 101d.

For example, referring to FIG. 15, the orthographic projection of the blocker BK on the base substrate partially overlaps with the orthographic projection of the fourth data line DT4 on the base substrate.

With reference to FIGS. 6, 9, 11 and 15, for example, the blocker BK located in the first pixel unit 101a and the second pixel unit 101b has a first edge E1 overlapping with the fourth data line DT4, and an included angle θ1 between the first edge E1 and the fourth data line DT4 is greater than zero and less than 90°. In other words, the included angle θ1 between the first edge E1 and the extending direction of the fourth data line DT4 is greater than zero and less than 90 degrees. The extending direction of the fourth data line DT4 is the second direction Y. In other words, the first edge E1 is inclined with respect to the fourth data line DT4. This arrangement is conducive to reducing the overlapping area between the fourth data line DT4 and the blocker BK, reducing parasitic capacitance and avoiding affecting the data writing speed of the fourth pixel unit.

With reference to FIGS. 6, 9, 11 and 15, for example, the blocker BK located in the first pixel unit 101a and the second pixel unit 101b has a second edge E2 overlapping with the third data line DT3, and an included angle θ2 between the second edge E2 and the third data line DT3 is greater than zero and less than 90°. Or, the included angle θ2 between the second edge E2 and the extending direction of the third data line DT3 is greater than zero and less than 90°. The extending direction of the third data line DT3 is the second direction Y. In other words, the second edge E2 is inclined with respect to the third data line DT3. This arrangement is conducive to reducing the overlapping area between the third data line DT3 and the blocker BK, reducing parasitic capacitance and avoiding affecting the data writing speed of the third pixel unit.

With reference to FIGS. 14, 16A and 21, the first pixel unit 101*a*, the second pixel unit 101*b*, the third pixel unit 101*c* and the fourth pixel unit 101*d* constitute a repeating unit RP. A plurality of repeating units RP can form an array. The repeating unit RP is the smallest repeating unit of the display array.

In FIG. 21, in the same pixel unit, the first reset transistor T6 and the second reset transistor T7 are connected with the same reset control signal line RT and input with the same reset control signal at the same time, but the embodiments of the present disclosure are not limited thereto.

In other embodiments, as illustrated by FIG. 1, in the same pixel unit, the first reset transistor T6 and the second reset transistor T7 may be connected with the first reset control signal line and the second reset control signal line, respectively, and the first reset control signal line and the second reset control signal line are insulated from each other to be input with signals respectively. In this case, signals are input to the first reset transistor T6 and the second reset transistor T7 at different times. As described above, the first reset transistor T6 is input with the reset control signal RESET in the first reset phase t1, and the second reset transistor T7 is input with the scan signal SCAN in the data writing, threshold compensation and the second reset phase t2. For example, the gate line GT of this stage is connected with the reset control signal line of the next stage. For example, the gate line GT and the second reset control signal line RT2 may be electrically connected and input with the same signal at the same time.

For example, as illustrated by FIG. 17, the second electrode T62 of the first reset transistor T6 is connected with the gate electrode T10 of the driving transistor T1 through a connection line CL. As described above, the second electrode T62 of the first reset transistor T6 is integrally formed with the second electrode T32 of the threshold compensation transistor T3, so that the second electrode T32 of the threshold compensation transistor T3 is connected with the gate electrode T10 of the driving transistor T1.

For example, as illustrated by FIG. 17, the orthographic projection of the shielding portion CEs on the base substrate BS at least partially overlaps with the orthographic projection of the second electrode T62 of the first reset transistor T6 on the base substrate BS. In the same way, because the second electrode T62 of the first reset transistor T6 is integrally formed with the second electrode T32 of the threshold compensation transistor T3, the orthographic projection of the shielding portion CEs on the base substrate BS at least partially overlaps with the orthographic projection of the second electrode T32 of the threshold compensation transistor T3 on the base substrate BS.

For example, as illustrated by FIG. 17, the orthographic projection of the shielding portion CEs on the base substrate BS does not overlap with the orthographic projection of the blocker BK on the base substrate BS, so that the upper end position of the shielding portion CEs in the second direction Y is defined.

For example, referring to FIGS. 9 and 17, the first initialization signal line INT1 and the second initialization signal line INT2 are respectively arranged on opposite sides of the gate electrode T10 of the driving transistor T1, and the orthographic projection of the shielding portion CEs on the base substrate BS partially overlaps with the orthographic projection of the second initialization signal line INT2 on the base substrate BS.

Further, for example, the orthographic projection of the shield portion CEs on the base substrate BS overlaps with the orthographic projection of the second conductive connection CP2 of the next row of pixel units on the base substrate BS, so that a capacitor is formed between the second conductive connection CP2 and the shielding portion CEs, which acts as a stabilization capacitor to reduce the leakage current of the first reset transistor T6.

For example, referring to FIGS. 15 and 17, the orthographic projection of the shielding portion CEs and the first initialization signal line INT1 on the base substrate BS does not overlap with each other.

For example, referring to FIG. 15, the first reset control signal line RT1 and the second reset control signal line RT2 are respectively arranged on opposite sides of the gate electrode T10 of the driving transistor T1, and referring to FIG. 17, the orthographic projection of the second reset control signal line RT2 on the base substrate BS and the orthographic projection of the shielding portion CEs on the base substrate BS do not overlap with each other. Thereby, the lower end position of the shielding portion CEs in the second direction Y is defined.

For example, referring to FIGS. 15 and 17, the orthographic projection of the first reset control signal line RT1 on the base substrate BS and the orthographic projection of the shielding portion CEs on the base substrate BS do not overlap with each other.

For example, referring to FIG. 15, the first reset control signal line extends along the first direction X, and the second reset control signal line extends along the first direction X.

In FIG. 14, each connection electrode CEf is connected with one light-emitting element, that is, each connection electrode CEf corresponds to one pixel unit 101. In FIG. 16A, each shielding portion CEs is connected with one light-emitting element, that is, each shielding portion CEs corresponds to one pixel unit 101.

For example, referring to FIG. 5, the orthographic projection of the first gate electrode T601 and the second gate electrode T602 of the first reset transistor T6 on the base substrate BS overlaps with the orthographic projection of the first channel T631 and the second channel T632 of the first reset transistor T6 on the base substrate BS, respectively.

For example, as illustrated by FIGS. 11 and 13, the first power line VDD1 is connected with the second electrode Cb of the storage capacitor Cst through the power supply connection line VDD0.

In the conventional technology, the threshold compensation transistor T3 is a double-gate transistor, and the intermediate node (the first conductive connection portion CP1) of the threshold compensation transistor T3 is disturbed by the jump of the scanning signal, and the voltage increases at the moment when the scanning signal is turned off, so that the leakage to the gate electrode of the driving transistor T1 is intensified, which may lead to a flicker problem.

For example, referring to FIGS. 13 and 15, in order to reduce the leakage of the threshold compensation transistor T3, the orthographic projection of the blocker BK on the base substrate BS at least partially overlaps with the orthographic projection of the first conductive connection CP1 on the base substrate BS. A stabilization capacitance is formed between the blocker BK and the first conductive connecting portion CP1. Increasing the parasitic capacitance between the intermediate node of the threshold compensation transistor T3 and the first voltage signal ELVDD can reduce the disturbance and improve the leakage problem.

The pixel circuit is formed on the base substrate to form the display panel shown in FIG. 15 or FIG. 17, and the light-emitting element is formed on the basis of the display panel shown in FIG. 15 or FIG. 17 to obtain a display panel capable of displaying, so that the pixel circuit is closer to the base substrate than the light-emitting element. As illustrated by FIG. 20, the pixel circuit 10 is closer to the base substrate BS than the light-emitting element 20.

For example, FIG. 18 is a sectional view taken along line AB in FIG. 17. FIG. 19 shows the first electrode 201 of the light-emitting element 20. FIG. 18 is a sectional view of a display panel provided in an embodiment of the present disclosure. The film layer on the first electrode 201 of the light-emitting element is omitted in FIG. 19. The layers above the first electrode 201 of the light-emitting element 20 can refer to the cross-sectional view. Of course, the arrangement position and shape of the first electrode 201 of the light-emitting element are not limited to those shown in FIG. 19, and those skilled in the art can adjust the arrangement position and shape of the first electrode 201 of the light-emitting element as needed.

Referring to FIGS. 18 and 20, a buffer layer BL is located on a substrate BS, an isolation layer BR is located on the buffer layer BL, and a channel region, a source electrode and a drain electrode of a transistor are located on the isolation layer BR. A first gate insulating layer GI1 is formed on the channel region, the source electrode and the drain electrode of the transistor, a first conductive pattern layer LY1 is located on the first gate insulating layer GI1, and a second gate insulating layer GI2 is located on the first conductive pattern layer LY1; a second conductive pattern layer LY2 is located on the second gate insulating layer GI2, an interlayer insulating layer ILD is located on the second conductive pattern layer LY2, a third conductive pattern layer LY3 is located on the interlayer insulating layer ILD, a passivation layer PVX is located on the first conductive pattern layer LY, a first planarization layer PLN1 is located on the passivation layer PVX, and a fourth conductive pattern layer LY4 is located on the first planarization layer PLN1.

With reference to FIG. 20, the second planarization layer PLN2 is located on the fourth conductive pattern layer LY4, the first electrode 201 of the light-emitting element 20 is located on the second planarization layer PLN2, and a pixel definition layer PDL and a spacer PS are located on the second planarization layer PLN2. The pixel definition layer PDL includes an opening OPN configured to define the light-emitting area (light-exiting area, effective light-emitting area) of the pixel unit. The spacer PS is configured to support a fine metal mask when forming the light-emitting functional layer 203.

For example, the opening OPN is the light-emitting region of the pixel unit. The light-emitting functional layer 203 is located on the first electrode 201 of the light-emitting element 20, and the second electrode 202 of the light-emitting element 20 is located on the light-emitting functional layer 203, and an encapsulation layer CPS is located on the light-emitting element 20. The encapsulation layer CPS includes a first encapsulation layer CPS1, a second encapsulation layer CPS2 and a third encapsulation layer CPS3. For example, the first encapsulation layer CPS1 and the third encapsulation layer CPS3 are inorganic material layers, and the second encapsulation layer CPS2 is an organic material layer. For example, the first electrode 201 is the anode of the light-emitting element 20, and the second electrode 202 is the cathode of the light-emitting element 20, but embodiments of the present disclosure are not limited thereto.

As illustrated by FIGS. 19 and 20, the first electrode 201 of the light-emitting element 20 is connected with the shielding portion CEs (connection electrode CEf) through a via hole H9 penetrating through the second planarization layer PLN2.

For example, the light-emitting element 20 includes an organic light-emitting diode. The light-emitting functional layer 203 is located between the second electrode 202 and the first electrode 201. The second electrode 202 is located on a side of the first electrode 201 away from the base substrate BS, and the light-emitting functional layer 203 at least includes a light-emitting layer, and may also include at least one of a hole transport layer, a hole injection layer, an electron transport layer and an electron injection layer.

As illustrated by FIG. 6 and FIG. 18, the second electrode Cb of the storage capacitor has an opening OPN1, and the setting of the opening OPN1 facilitates the connection between the connection electrode CEb and the gate electrode T10 of the driving transistor T1.

For example, the transistors in the pixel circuit of the embodiment of the present disclosure are all thin film transistors. For example, the first conductive pattern layer LY1, the second conductive pattern layer LY2, the third conductive pattern layer LY3, and the fourth conductive pattern layer LY4 are all made of metal materials. For example, the first conductive pattern layer LY1 and the second conductive pattern layer LY2 are formed of metal materials such as nickel and aluminum, but are not limited thereto. For example, the third conductive pattern layer LY3 and the fourth conductive pattern layer LY4 are formed of materials such as titanium and aluminum, but are not limited thereto. For example, the third conductive pattern layer LY3 and the fourth conductive pattern layer LY4 have a structure formed by three sub-layers of Ti/AL/Ti, respectively, but are not limited thereto. For example, the base substrate can be a glass substrate or a polyimide substrate, but is not limited thereto, and can be selected as required. For example, the first gate insulating layer GI1, the second gate insulating layer GI2, the interlayer insulating layer ILD, the passivation layer PVX, the first planarization layer PLN1, the second planarization layer PLN2, the pixel definition layer PDL, and the spacer PS are all made of insulating materials. Materials of the first electrode 201 and the second electrode 202 of the light-emitting element can be selected as required. In some embodiments, the first electrode 201 may adopt at least one of transparent conductive metal oxide and silver, but is not limited thereto. For example, the transparent conductive metal oxide includes indium tin oxide (ITO), but is not limited thereto. For example, the first electrode 201 may adopt a structure in which ITO-Ag-ITO is stacked in three sub-layers. In some embodiments, the second electrode 202 may be a metal with low work function, and at least one of magnesium and silver may be used, but is not limited thereto.

In the display panel provided by the embodiment of the present disclosure, the blocker BK having the structure shown in FIG. 6 may not be provided, and of course, the shielding portion CEs shown in FIG. 16A may not be provided. For example, in some embodiments, no blocker BK is provided, or blockers of other shapes or structures are provided. For example, in some embodiments, the shield portion CEs is not provided, but the connection electrode CEf as illustrated by FIG. 14 is provided.

The display panel provided by the embodiment of the present disclosure can be manufactured according to the structure of the display panel. A feasible manufacturing method is listed below. It should be noted that the manufacturing method of the display panel provided by the embodiment of the present disclosure is not limited to the following methods.

The manufacturing method will be described with reference to the previous drawings. The manufacturing method of the display panel provided by the embodiment of the disclosure comprises the following steps.

S1, forming a buffer layer BL on a base substrate.

S2, forming an isolation layer BR on the buffer layer BL.

S3, forming a semiconductor pattern SCP on the isolation layer BR.

S4, forming a first gate insulating layer GI1 on the semiconductor pattern SCP.

S5, forming a first conductive film on the first gate insulating layer GI1, and patterning the first conductive film to form a first conductive pattern layer LY1.

S6, doping the semiconductor pattern SCP with the first conductive pattern layer LY1 as a mask to form an active layer ACT, a source electrode and a drain electrode of the transistor.

S7, forming a second gate insulating layer GI2.

S8, forming a second conductive film on the second gate insulating layer GI2, and patterning the second conductive film to form a second conductive pattern layer LY2.

S9, forming an interlayer insulating layer ILD on the second conductive pattern layer LY2.

S10, forming via holes in at least one of the first gate insulating layer GI1, the second gate insulating layer GI2 and the interlayer insulating layer ILD (refer to FIG. 8).

S11, forming a third conductive film on the interlayer insulating layer ILD, and patterning the third conductive film to form a third conductive pattern layer LY3. Components in the third conductive pattern layer LY3 are respectively connected with components in the second conductive pattern layer LY2 and the source electrode and drain electrode of the transistor through via holes.

S12, forming a passivation layer PVX and a first planarization layer PLN1.

S13, forming via holes in the passivation layer PVX and the first planarization layer PLN1 (refer to FIG. 12).

S14, forming a fourth conductive film on the first planarization layer PLN1, and patterning the fourth conductive film to form a fourth conductive pattern layer LY4. Components in the fourth conductive pattern layer LY4 may be connected with components in the third conductive pattern layer LY3 through via holes in the passivation layer PVX and the first planarization layer PLN1.

S15, forming a first electrode 201 of a light-emitting element 20 on the fourth conductive pattern layer LY4.

S16, forming a pixel definition layer PDL and a spacer PS.

S17, forming a light-emitting functional layer 203 of the light-emitting element 20.

S18, forming a second electrode 202 of the light-emitting element 20.

S19, forming an encapsulation layer CPS.

At least one embodiment of the present disclosure also provides a display device, which comprises any one of the above display panels. For example, the display device includes OLEDs or products driven at high frame rates including OLEDs. For example, the display device includes any products or components with display functions such as televisions, digital cameras, mobile phones, watches, tablet computers, notebook computers, navigators, etc.

The above description takes the pixel circuit of 7T1C as an example, and embodiments of the present disclosure include but are not limited thereto. It should be noted that the embodiment of the present disclosure does not limit the number of thin film transistors and the number of capacitors included in the pixel circuit. For example, in other embodiments, the pixel circuit of the display panel may also be a structure including other numbers of transistors, such as 7T2C structure, 6T1C structure, 6T2C structure or 9T2C structure, which is not limited by the embodiments of the present disclosure.

In an embodiment of the present disclosure, elements located in the same layer can be formed by the same film layer and the same patterning process. For example, components located on the same layer may be located on the surface of the same component away from the base substrate.

It should be noted that the thicknesses of layers or regions are exaggerated in the drawings for describing embodiments of the present disclosure for the sake of clarity. It can be understood that when an element such as a layer, film, region or substrate is described to be located "on" or "under" another element, the element may be "directly" located "on" or "under" another element, or there may be intermediate elements.

In an embodiment of the present disclosure, the patterning or patterning process may include only a photolithography process, or a photolithography process and an etching step, or may include printing, ink-jet and other processes for forming a predetermined pattern. The photolithography process refers to a process including film formation, exposure and development, which uses photoresist, mask plate and exposure machine to form a pattern. The corresponding patterning process can be selected according to the structure formed in the embodiments of the present disclosure.

In case of no conflict, features in one embodiment or in different embodiments of the present disclosure can be combined.

The foregoing are only the specific embodiments of the disclosure, but the protection scope of the disclosure is not limited thereto. Any changes or substitutions which can be easily conceived by those skilled in the art within the technical scope disclosed in the disclosure should be covered within the protection scope of the disclosure. Therefore, the protection scope of the present disclosure should be based on the protection scope of the claims.

The invention claimed is:

1. A display panel, comprising:
   a base substrate;
   a pixel unit, located on the base substrate and comprising a pixel circuit and a light-emitting element, the pixel circuit being configured to drive the light-emitting element, the pixel circuit being closer to the base substrate than the light-emitting element, the pixel circuit comprising a driving transistor;
   a data line, configured to provide a data signal to the pixel circuit;
   a connection element, the light-emitting element being connected with the pixel circuit through the connection element, the connection element comprising a shielding portion; and
   a connection line, connected with a gate electrode of the driving transistor,
   wherein the data line comprises two adjacent data lines, the shielding portion is located between the two adjacent data lines, an orthographic projection of the connection line on the base substrate at least partially overlaps with an orthographic projection of the shielding portion on the base substrate, and a potential of the connection element is the same as a potential of the shielding portion in the connection element.

2. The display panel according to claim 1, wherein the orthographic projection of the shielding portion on the base substrate is larger than the orthographic projection of the connection line on the base substrate.

3. The display panel according to claim 1, wherein the connection element and the shielding portion of the connection element are of an integral structure.

4. The display panel according to claim 1, wherein the connection line is in contact with the gate electrode of the driving transistor.

5. The display panel according to claim 1, wherein the data line and the shielding portion are located in the same layer, and an extending direction of the shielding portion and an extending direction of the data line are the same.

6. The display panel according to claim 1, further comprising a first conductive structure, wherein the connection line is connected with the first conductive structure, the orthographic projection of the shielding portion on the base substrate at least partially overlaps with an orthographic projection of the first conductive structure on the base substrate.

7. The display panel according to claim 6, wherein the pixel circuit further comprises a first reset transistor, a second electrode of the first reset transistor is connected with the gate electrode of the driving transistor, and the first conductive structure is multiplexed as the second electrode of the first reset transistor, wherein the display panel further comprises a first reset control signal line and a first initialization signal line, wherein a gate electrode of the first reset transistor is connected with the first reset control signal line, a first electrode of the first reset transistor is connected with the first initialization signal line.

8. The display panel according to claim 7, wherein the first reset transistor comprises a first channel and a second channel, the first channel and the second channel of the first reset transistor are connected through a conductive connection portion, the orthographic projection of the shielding portion on the base substrate overlaps with an orthographic projection of the conductive connection portion of the first rest transistor on the base substrate.

9. The display panel according to claim 7, further comprising a second initialization signal line, wherein the first initialization signal line and the second initialization signal line are respectively located at two opposite sides of the gate electrode of the driving transistor, the orthographic projection of the shielding portion on the base substrate partially overlaps with an orthographic projection of the second initialization signal line on the base substrate.

10. The display panel according to claim 9, further comprising a second reset control signal line, wherein the pixel circuit further comprises a second reset transistor, a gate electrode of the second reset transistor is connected with the second reset control signal line, a first electrode of the second reset transistor is connected with the second initialization signal line, and a second electrode of the second reset transistor is connected with a first electrode of the light-emitting element.

11. The display panel according to claim 6, further comprising a first power line and a blocker, wherein the first power line is configured to supply a first power supply voltage to the pixel circuit, the blocker is electrically connected with the first power line, an orthographic projection of the first conductive structure on the base substrate at least partially overlaps with an orthographic projection of the blocker on the base substrate,
wherein a material of the first conductive structure is different from a material of the connection line.

12. The display panel according to claim 11, further comprising a second conductive structure, the data line is connected with the second conductive structure, the orthographic projection of the blocker on the base substrate at least partially overlaps with an orthographic projection of the second conductive structure on the base substrate.

13. The display panel according to claim 11, further comprising a gate line, wherein the gate line and the data line cross with each other and are insulated from each other, the gate line is configured to supply a scanning signal to the pixel circuit, the pixel circuit further comprises a threshold compensation transistor, a first electrode of the threshold compensation transistor is connected with a second electrode of the driving transistor, a second electrode of the threshold compensation transistor is connected with the gate electrode of the driving transistor; a gate electrode of the threshold compensation transistor is connected with the gate line;

the gate electrode of the driving transistor is connected with the second electrode of the threshold compensation transistor through the connection line, the threshold compensation transistor comprises a first channel and a second channel, and the first channel and the second channel are connected by a conductive connection portion;

an orthographic projection of the blocker on the base substrate at least partially overlaps with an orthographic projection of the conductive connection portion of the threshold compensation transistor on the base substrate, wherein an area of an orthographic projection of a portion of the blocker overlapping with the first conductive structure on the base substrate is larger than an area of an orthographic projection of a portion of the blocker overlapping with the conductive connection portion of the threshold compensation transistor on the base substrate.

14. The display panel according to claim 13, wherein the pixel circuit further comprises a first power supply terminal and a storage capacitor, a first electrode of the storage capacitor is connected with the gate electrode of the driving transistor, a second electrode of the storage capacitor is connected with the first power supply terminal, wherein the pixel circuit further comprises a data writing transistor, a gate electrode of the data writing transistor is connected with the gate line, a first electrode of the data writing transistor is connected with the data line, and a second electrode of the data writing transistor is connected with a first electrode of the driving transistor.

15. The display panel according to claim 14, further comprising a light-emitting control signal line, wherein the pixel circuit further comprises a first light-emitting control transistor and a second light-emitting control transistor, a gate electrode of the first light-emitting control transistor is connected with the light-emitting control signal line, a first electrode of the first light-emitting control transistor is connected with the first power supply terminal, and a second electrode of the first light-emitting control transistor is connected with the first electrode of the driving transistor;

a gate electrode of the second light-emitting control transistor is connected with the light-emitting control signal line, a first electrode of the second light-emitting control transistor is connected with the second electrode of the driving transistor, and a second electrode of the second light-emitting control transistor is connected with the first electrode of the light-emitting element.

16. The display panel according to claim 15, wherein the data line comprises a first portion and a second portion, a distance between first portions of the two adjacent data lines is larger than a distance between second portions of the two adjacent data lines, the shielding portion is located between the second portions of the two adjacent data lines, wherein the second portions of the two adjacent data lines are respectively close to the first light-emitting control transistor and the second light-emitting control transistor, and the storage capacitor is located between the first portions of the two adjacent data lines.

17. The display panel according to claim 1, wherein the pixel unit comprises two adjacent pixel units located in the same column, the two adjacent data lines are respectively connected with the two adjacent pixel units.

18. The display panel according to claim 1, wherein the connection element further comprises a connection electrode, the connection electrode is connected with the pixel circuit, and the light-emitting element is connected with the connection electrode through the shielding portion.

19. A display panel, comprising:
a base substrate;
a pixel unit, located on the base substrate and comprising a pixel circuit and a light-emitting element, the pixel circuit being configured to drive the light-emitting element, the pixel circuit being closer to the base substrate than the light-emitting element, the pixel circuit comprising a driving transistor;
a data line, configured to provide a data signal to the pixel circuit;
a connection element, the light-emitting element being connected with the pixel circuit through the connection element, the connection element comprising a shielding portion; and
a connection line, connected with a gate electrode of the driving transistor,
wherein the data line comprises two adjacent data lines, the shielding portion is located between the two adjacent data lines, an orthographic projection of the connection line on the base substrate at least partially overlaps with an orthographic projection of the shielding portion on the base substrate,
an orthographic projection of the gate electrode of the driving transistor on the base substrate overlaps with the orthographic projection of the shielding portion on the base substrate, an area of an overlapping portion of the shielding portion and the gate electrode of the driving transistor is smaller than an area of the gate electrode of the driving transistor.

20. A display panel, comprising:
a base substrate;
a pixel unit, located on the base substrate and comprising a pixel circuit and a light-emitting element, the pixel circuit being configured to drive the light-emitting element, the pixel circuit being closer to the base substrate than the light-emitting element, the pixel circuit comprising a driving transistor;
a data line, configured to provide a data signal to the pixel circuit;
a connection element, the light-emitting element being connected with the pixel circuit through the connection element, the connection element comprising a shielding portion; and
a connection line, connected with a gate electrode of the driving transistor,
wherein the data line comprises two adjacent data lines, the shielding portion is located between the two adjacent data lines, an orthographic projection of the connection line on the base substrate at least partially overlaps with an orthographic projection of the shielding portion on the base substrate,
the two adjacent data lines are arranged along a first direction, and the data lines extend along a second direction,
a size of the gate electrode of the driving transistor in the first direction is larger than a size of the shielding portion in the first direction;
a size of the shielding portion in the second direction is larger than a size of the gate electrode of the driving transistor in the second direction.

* * * * *